(12) United States Patent
Jain et al.

(10) Patent No.: US 11,581,271 B2
(45) Date of Patent: Feb. 14, 2023

(54) METHODS TO PATTERN TFC AND INCORPORATION IN THE ODI ARCHITECTURE AND IN ANY BUILD UP LAYER OF ORGANIC SUBSTRATE

(71) Applicant: Intel Corporation, Santa Clara, CA (US)

(72) Inventors: Rahul Jain, Gilbert, AZ (US); Kyu-Oh Lee, Chandler, AZ (US); Islam A. Salama, Chandler, AZ (US); Amruthavalli P. Alur, Tempe, AZ (US); Wei-Lun K. Jen, Chandler, AZ (US); Yongki Min, Phoenix, AZ (US); Sheng C. Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 16/353,164

(22) Filed: Mar. 14, 2019

(65) Prior Publication Data

US 2020/0294938 A1 Sep. 17, 2020

(51) Int. Cl.
*H01L 23/64* (2006.01)
*H01L 23/498* (2006.01)
*H01L 49/02* (2006.01)
*H01L 23/538* (2006.01)

(52) U.S. Cl.
CPC ...... *H01L 23/642* (2013.01); *H01L 23/49822* (2013.01); *H01L 23/49838* (2013.01); *H01L 23/5383* (2013.01); *H01L 23/5386* (2013.01); *H01L 28/65* (2013.01)

(58) Field of Classification Search
CPC ............ H01L 23/642; H01L 23/49822; H01L 23/49838; H01L 23/5383; H01L 23/5386; H01L 28/65
See application file for complete search history.

(56) References Cited

U.S. PATENT DOCUMENTS

| | | | |
|---|---|---|---|
| 7,588,992 B2 * | 9/2009 | Min | H01L 21/4857 257/E21.008 |
| 2009/0140400 A1 * | 6/2009 | Arney, Jr. | H05K 1/162 257/664 |
| 2009/0200638 A1 * | 8/2009 | Smith | H01L 21/76816 257/532 |

(Continued)

*Primary Examiner* — Peniel M Gumedzoe
(74) *Attorney, Agent, or Firm* — Schwabe, Williamson & Wyatt, P.C.

(57) ABSTRACT

Embodiments include semiconductor packages. A semiconductor package includes a plurality of build-up layers and a plurality of conductive layers in the build-up layers. The conductive layers include a first conductive layer and a second conductive layer. The first conductive layer is over the second conductive layer and build-up layers, where a first via couples the first and second conductive layers. The semiconductor package also includes a thin film capacitor (TFC) in the build-up layers, where a second via couples the TFC to the first conductive layer, and the second via has a thickness less than a thickness of the first via. The first conductive layer may be first level interconnects. The build-up layers may be dielectrics. The TFC may include a first electrode, a second electrode, and a dielectric. The first electrode may be over the second electrode, and the dielectric may be between the first and second electrodes.

27 Claims, 17 Drawing Sheets

(56) References Cited

U.S. PATENT DOCUMENTS

2016/0027579 A1* 1/2016 Kurachi ................ H01G 4/224
                                                    361/321.1
2019/0096851 A1* 3/2019 Liao ..................... H01L 21/563

* cited by examiner

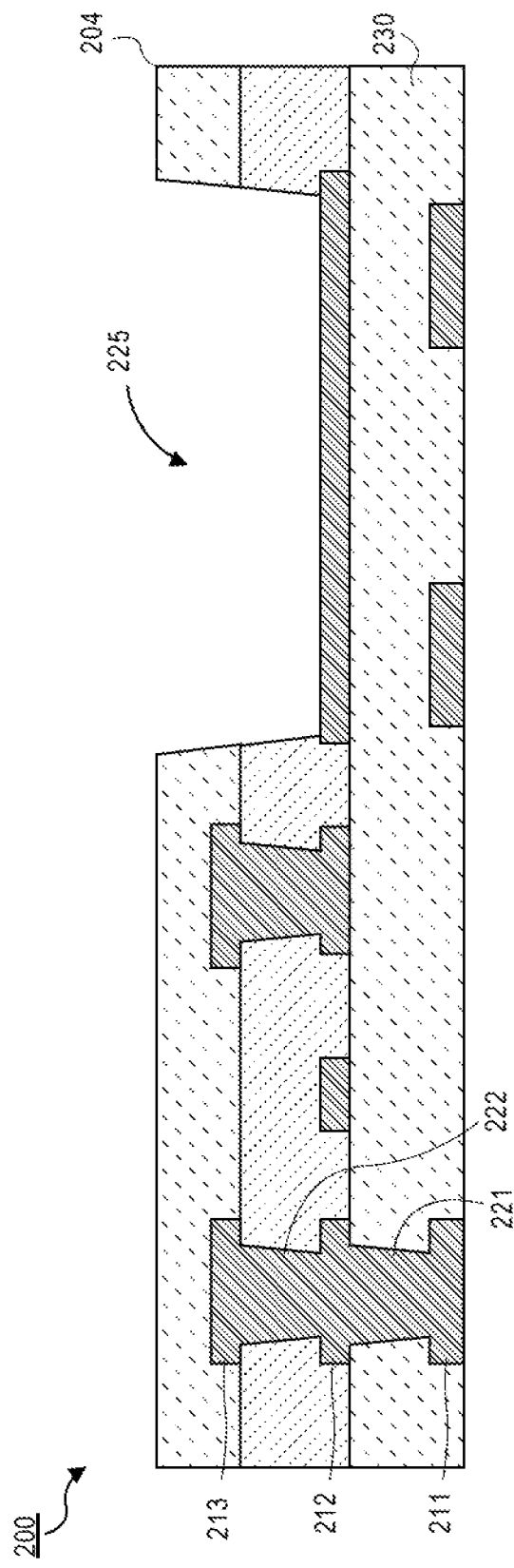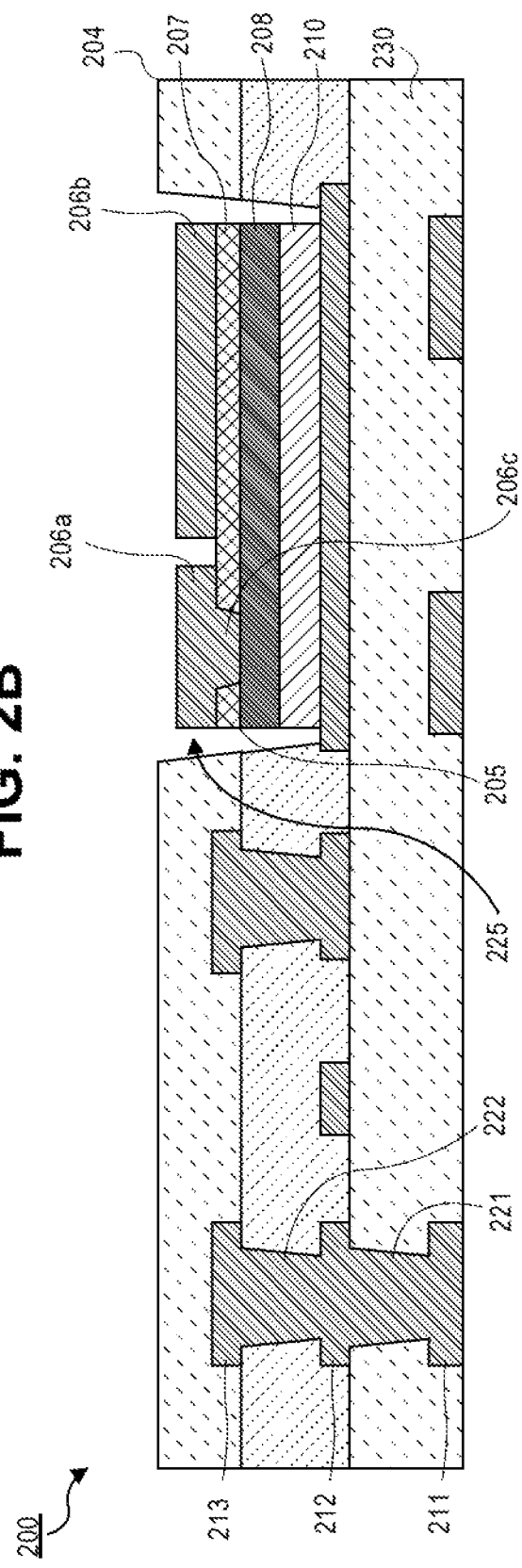

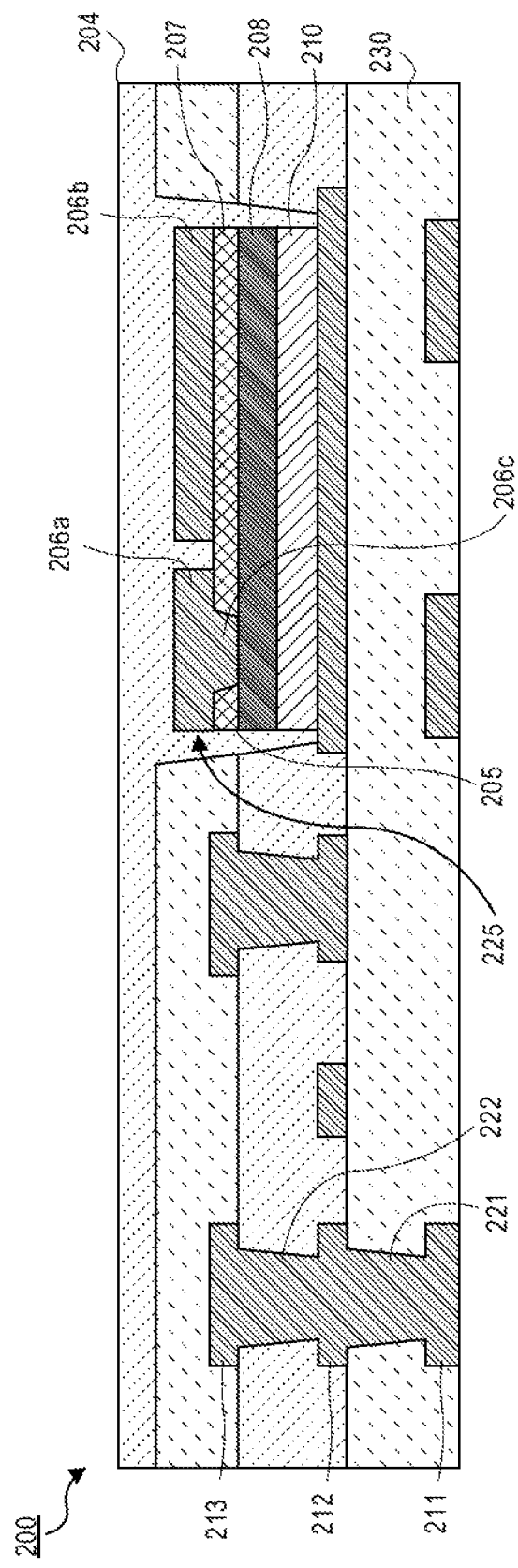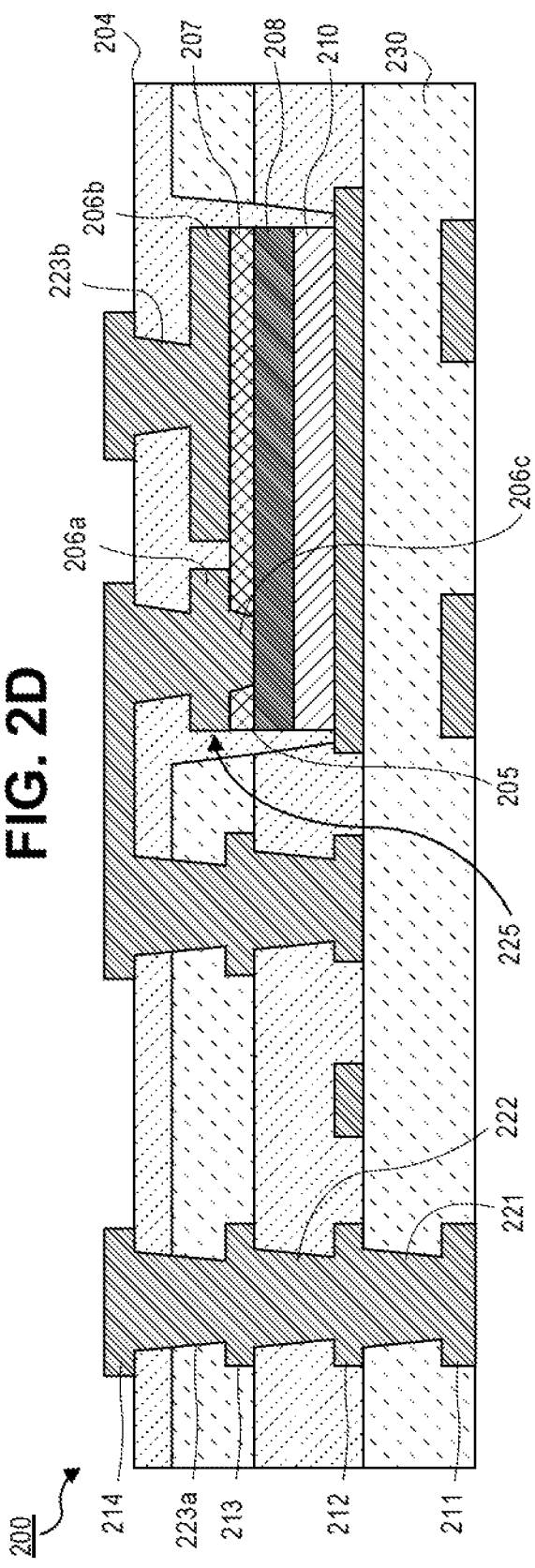

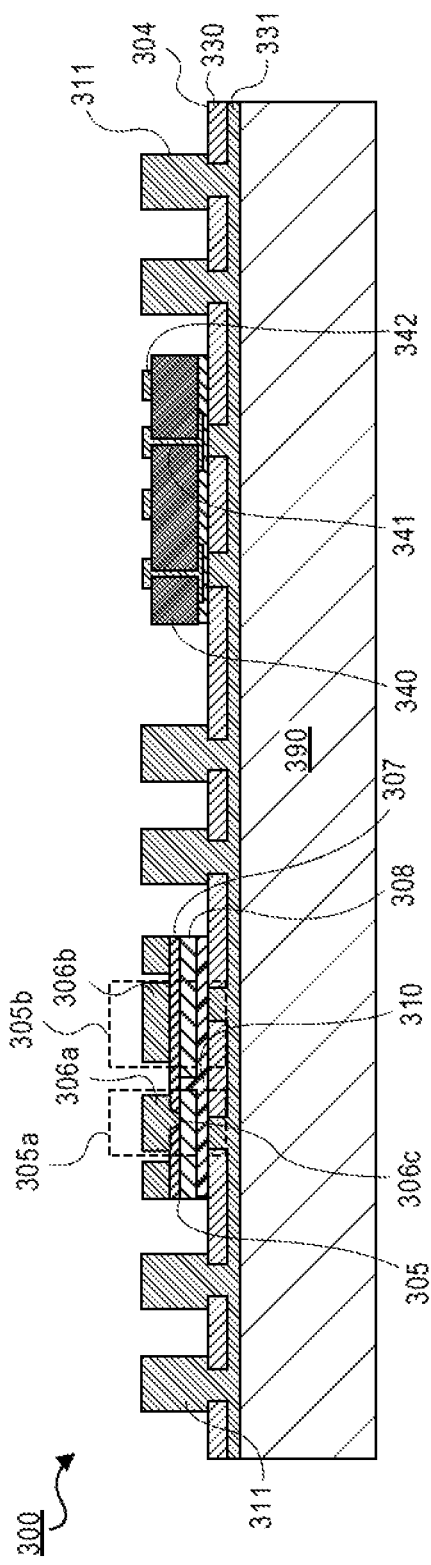
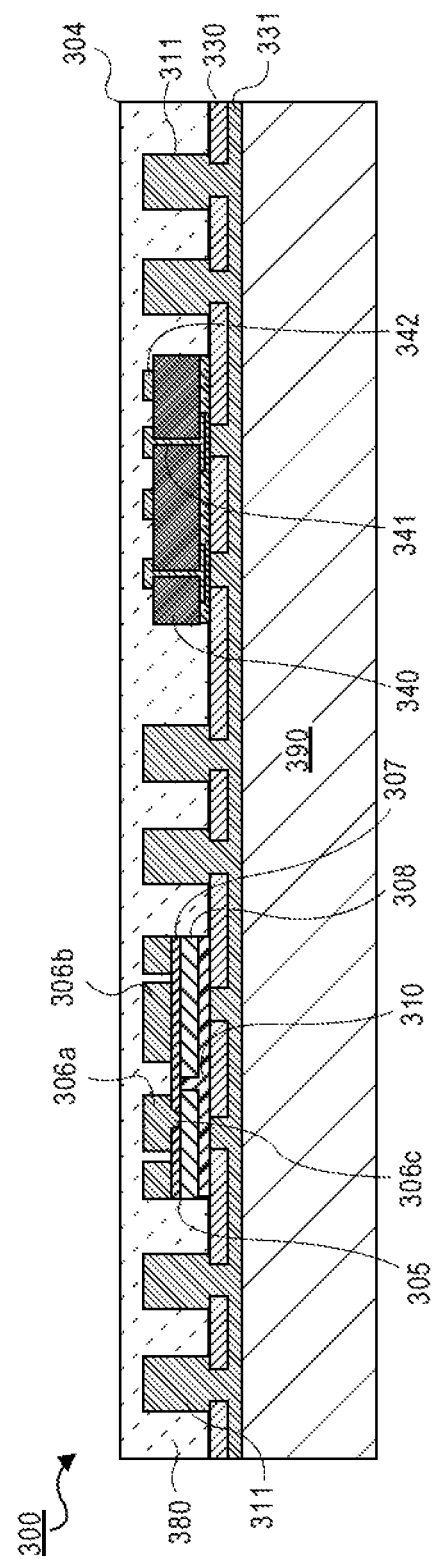
FIG. 3F
FIG. 3G

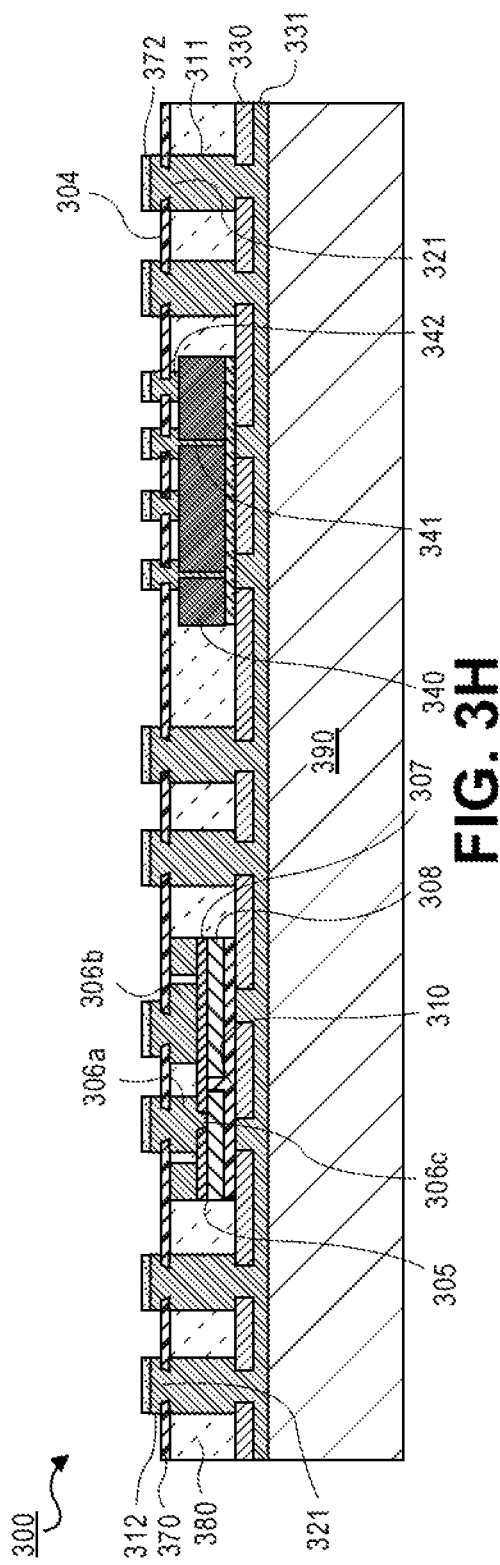
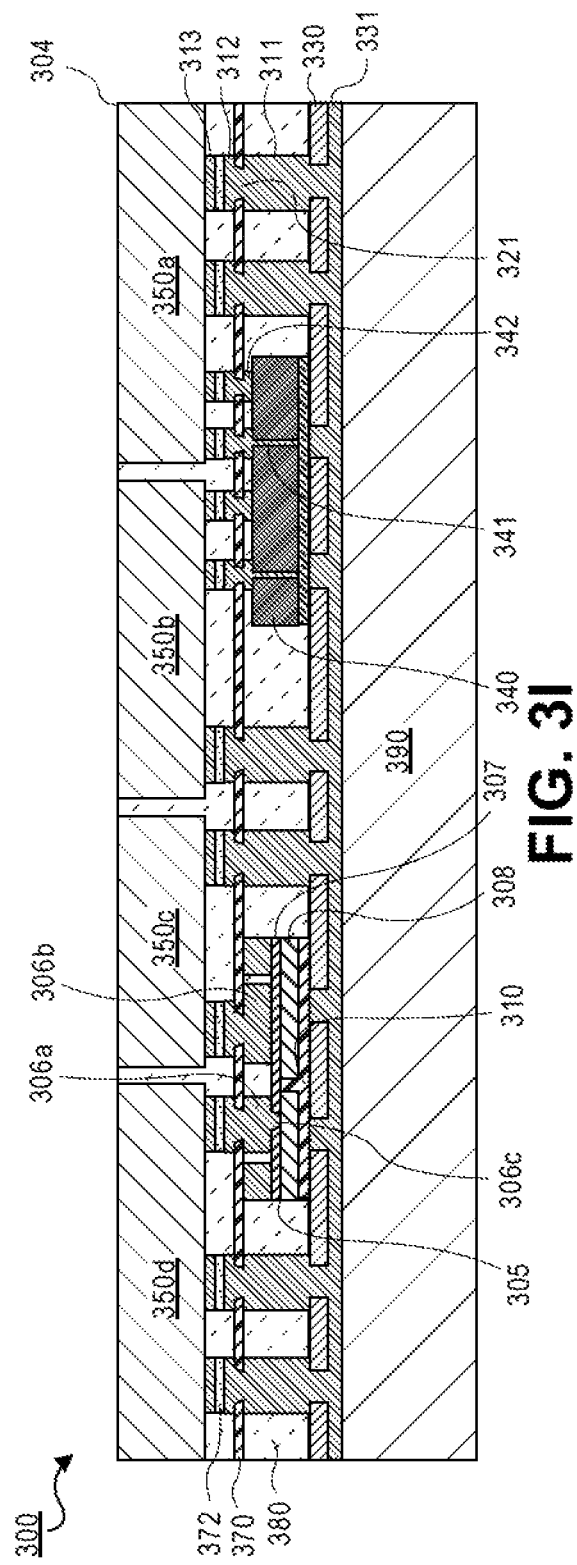

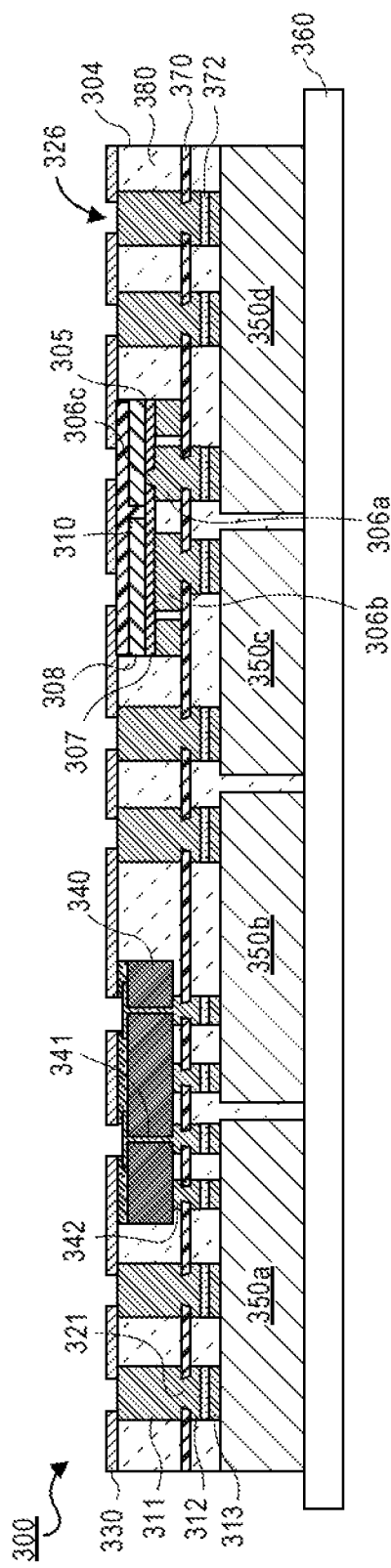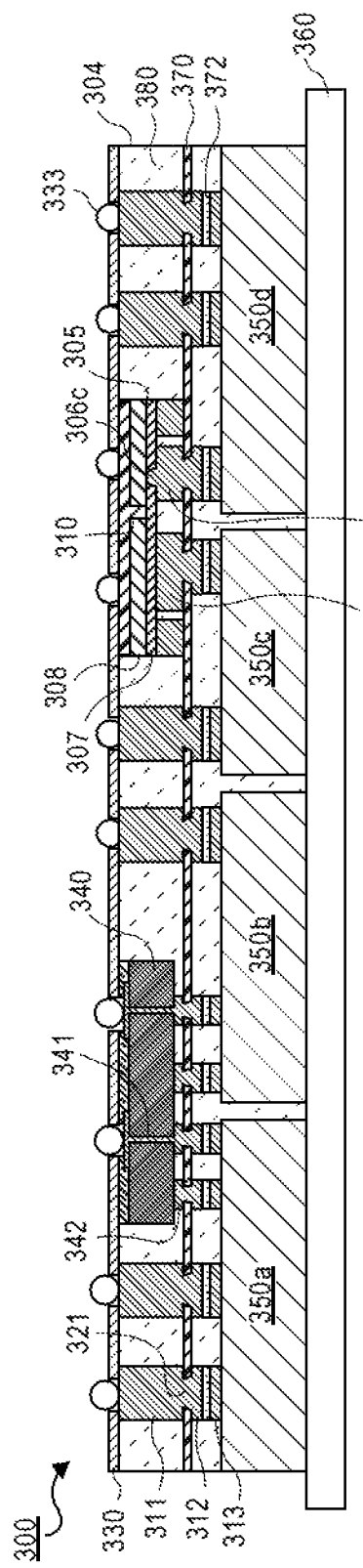
FIG. 3J
FIG. 3K

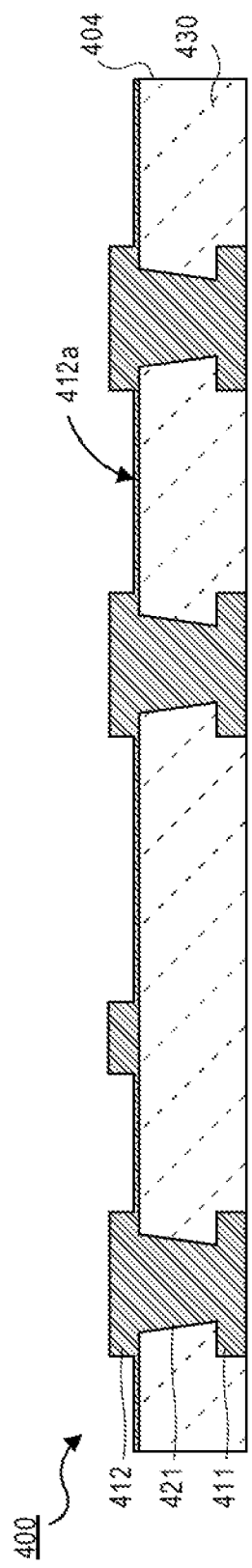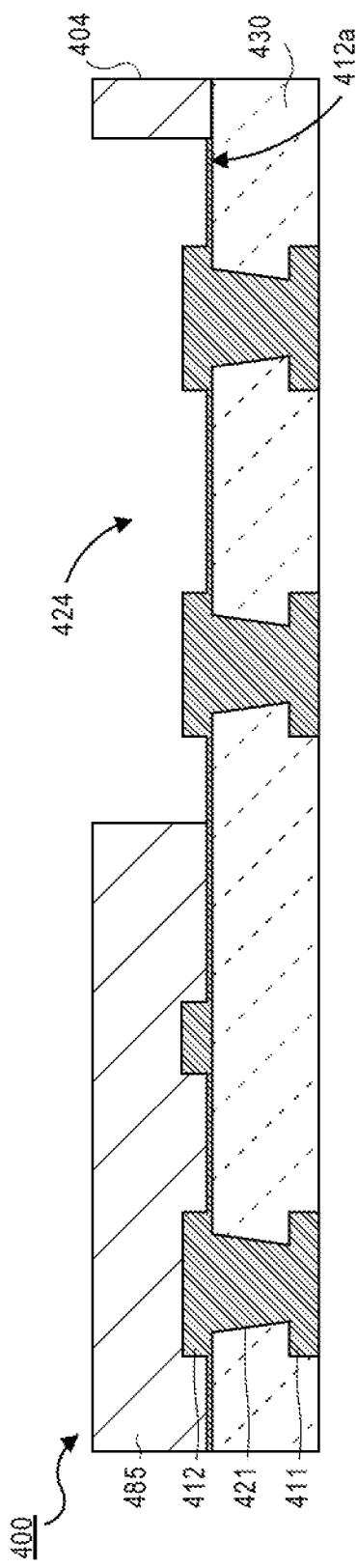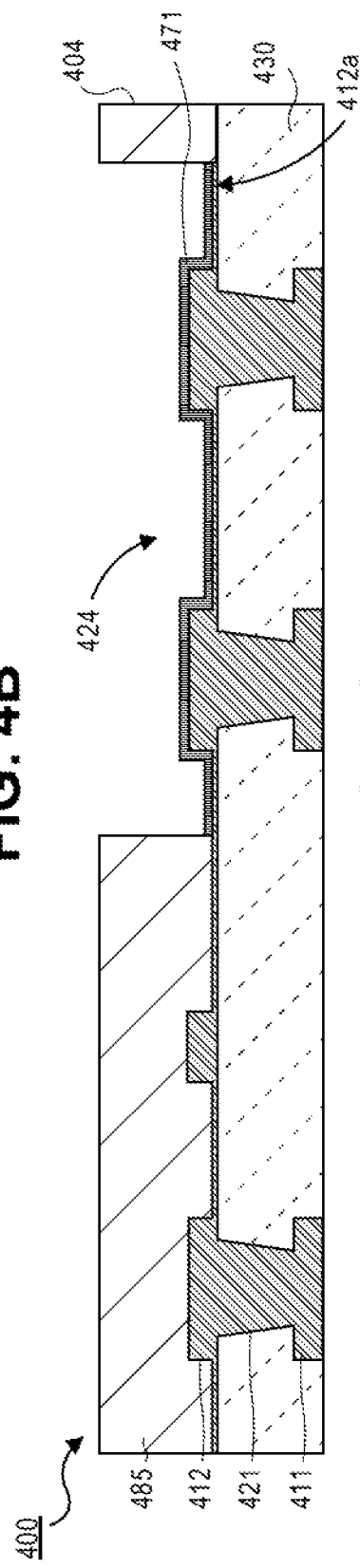
FIG. 4A
FIG. 4B
FIG. 4C

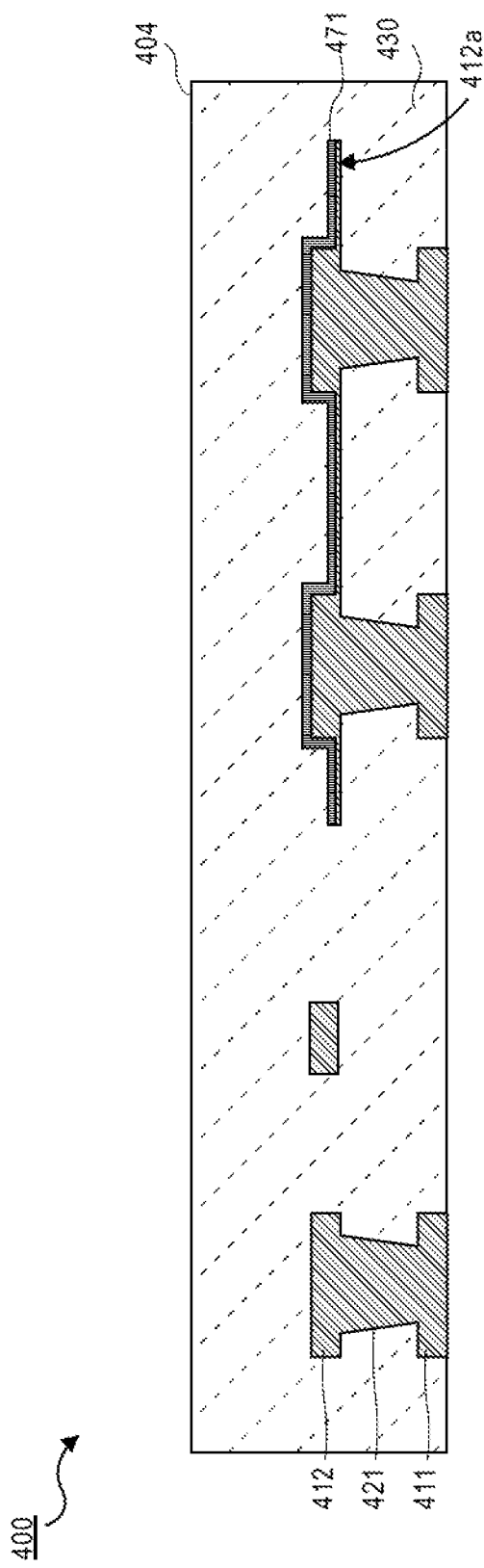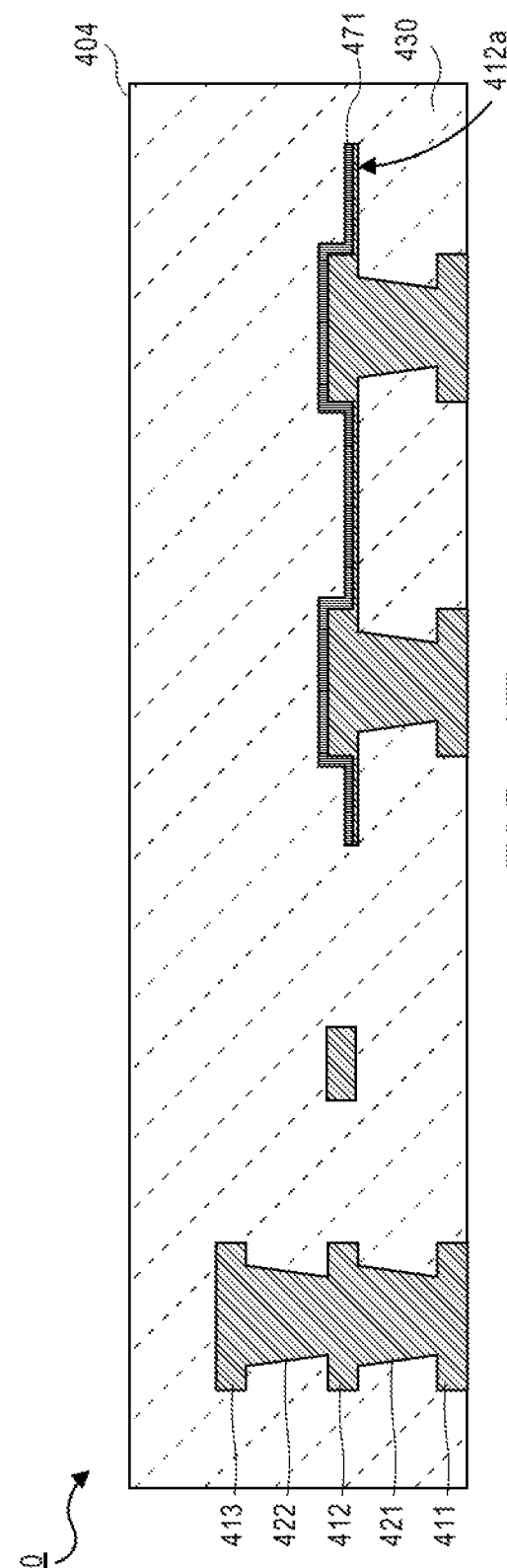

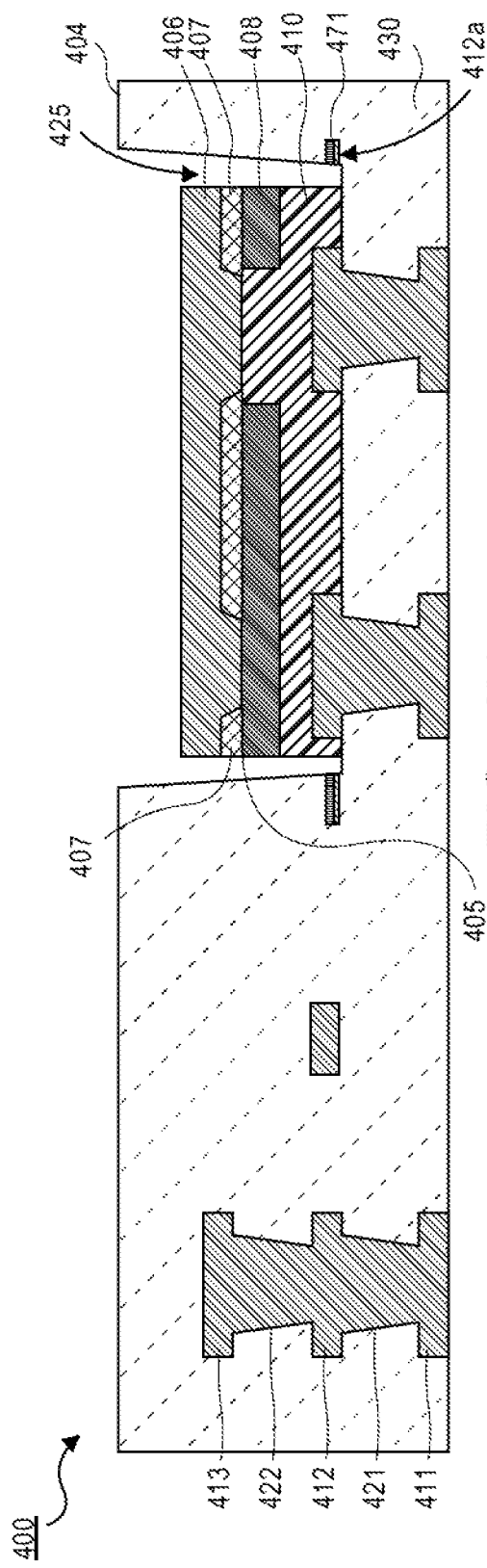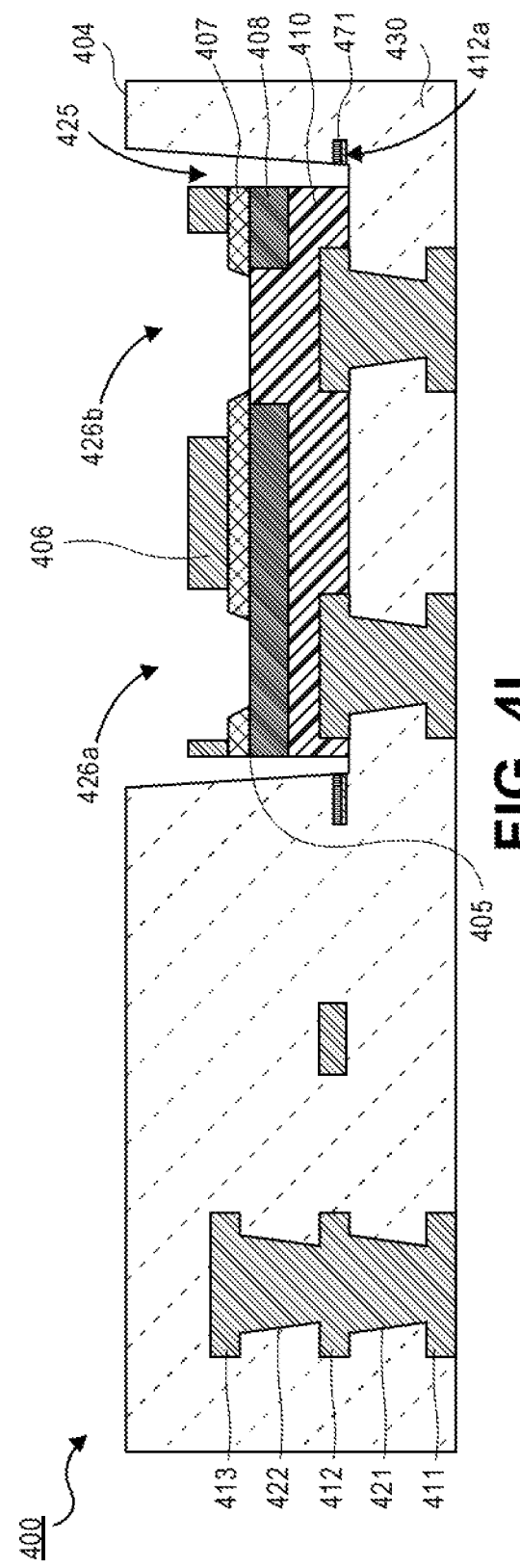

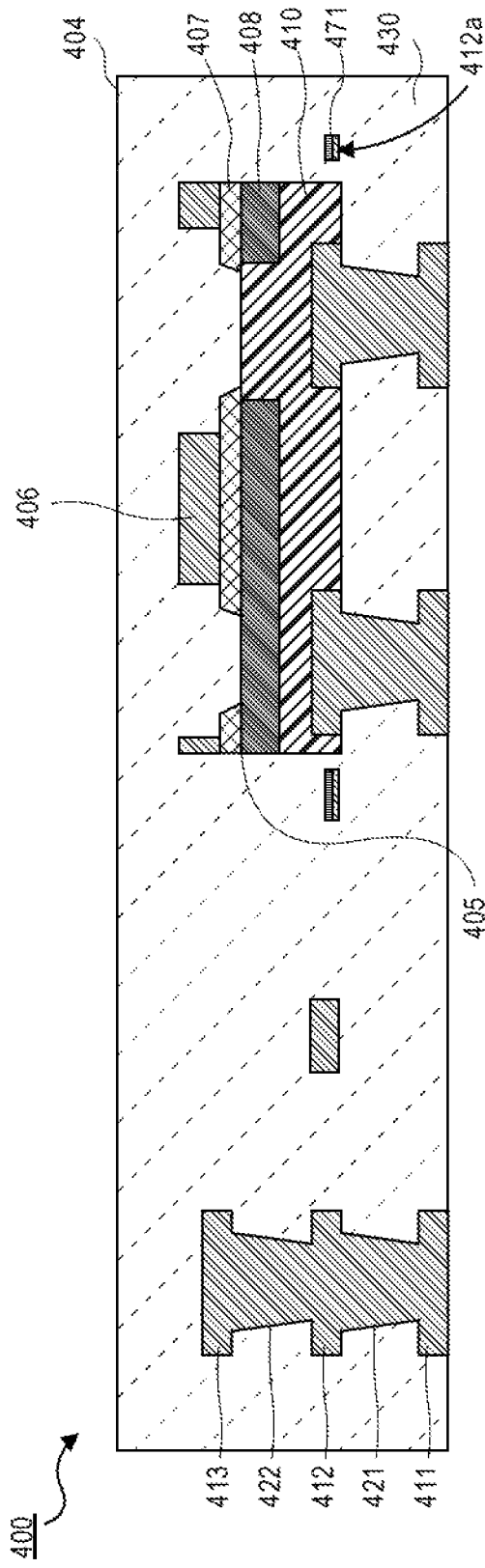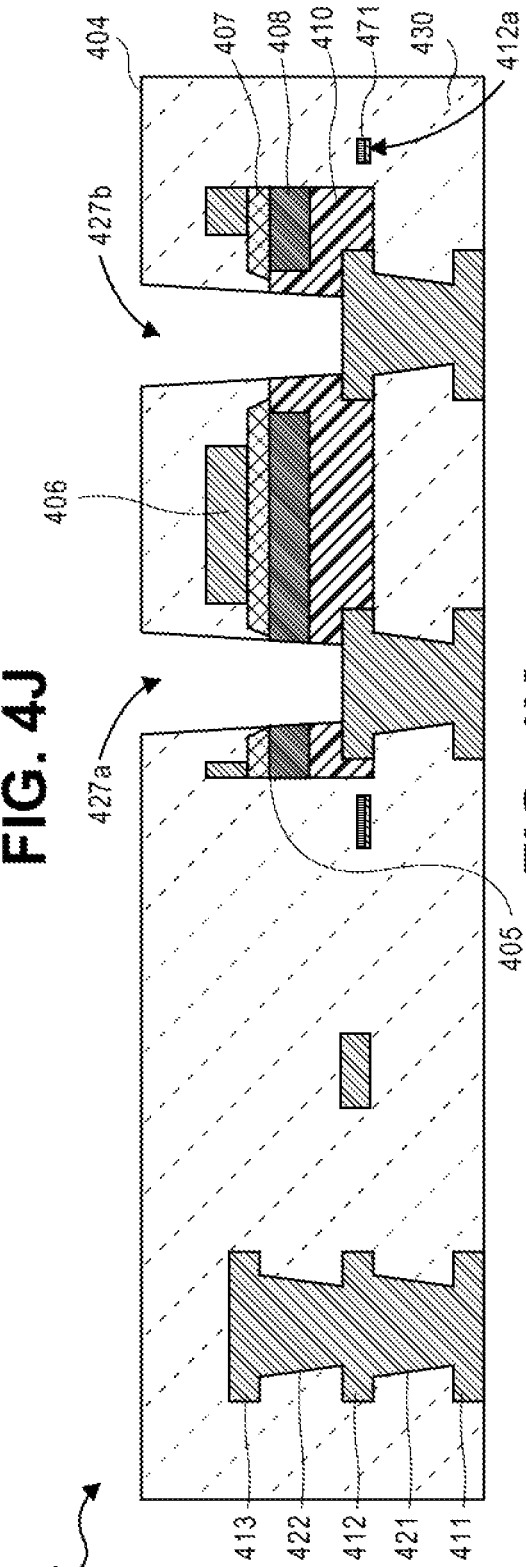

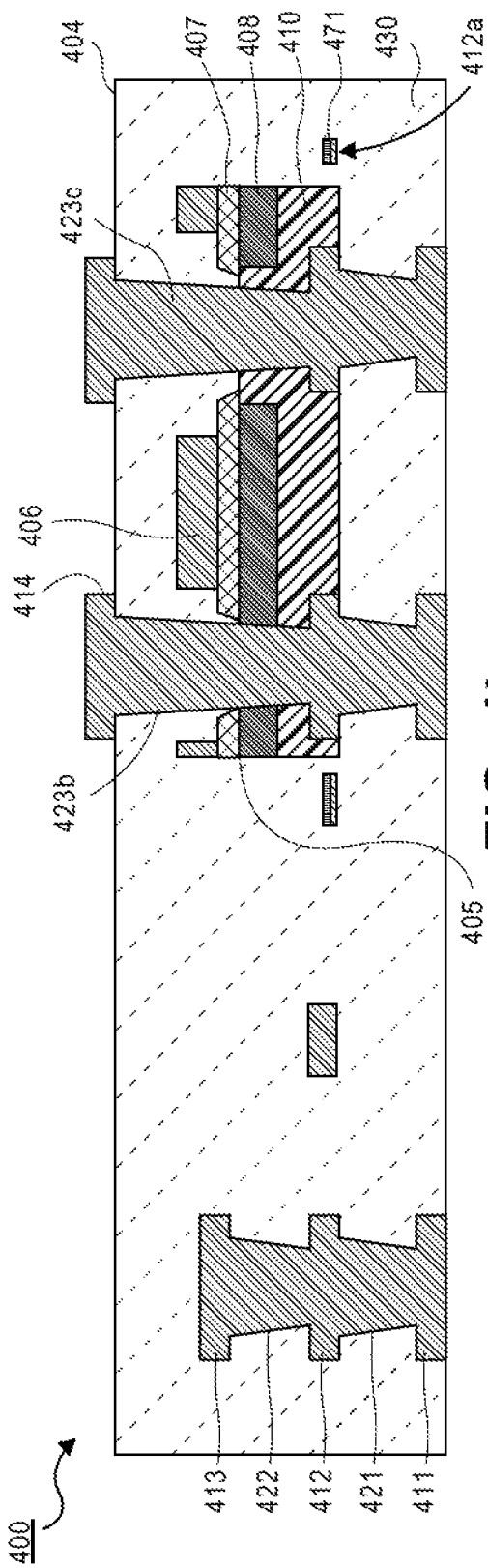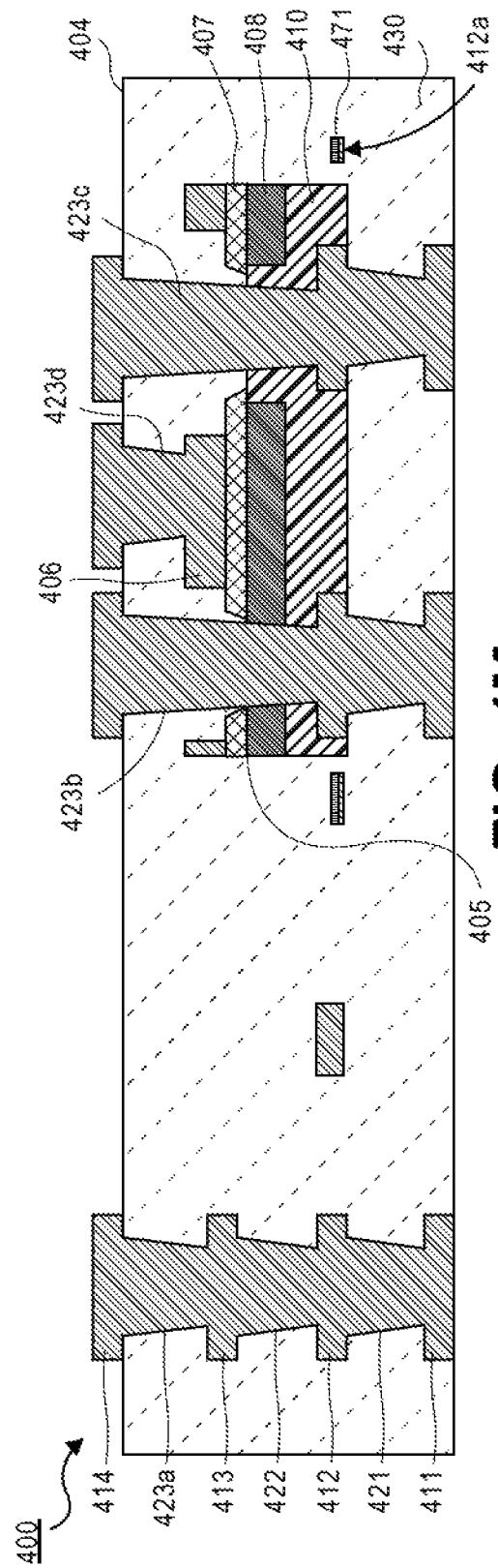

METHODS TO PATTERN TFC AND INCORPORATION IN THE ODI ARCHITECTURE AND IN ANY BUILD UP LAYER OF ORGANIC SUBSTRATE

FIELD

Embodiments relate to packaging semiconductor devices. More particularly, the embodiments relate to semiconductor devices incorporated with thin film capacitors (TFCs).

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. For example, many efforts have been taken to integrate thin film capacitors (TFCs) into semiconductor devices to improve the performance of such devices. The drive to scale these ICs while optimizing the performance of each device, however, is not without issue.

Existing IC solutions have enabled improvements in voltage regulation technology, socket technology, package copper thickness, etc., by driving down the low to mid frequency portion (e.g., <5 MHz) of power delivery impedance profile. The existing technologies, however, have not been able to significantly improve the high frequency portion (e.g., >10 MHz) of the power delivery impedance profile. For example, the reduction in inductance to the capacitors of such devices can be an effective solution to address the first droop impedance, but this solution is hard to achieve with traditional decoupling options.

To reduce capacitor inductance in these shrinking ICs, existing technologies have used discrete capacitors and incorporated them into package substrate manufacturing. This approach includes embedding capacitors into the core area of a substrate. The embedded capacitors within the core area of the substrate, however, fail to provide a significant reduction in the first droop impedance profile. Another approach includes disposing land side capacitors (LSCs) on the substrate to reduce the first droop impedance profile. But, this approach can only reduce the first droop impedance profile by roughly 25% as the inductance contribution from the substrate vias become the primary bottleneck.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 2A-2E are illustrations of cross-sectional views of a process flow to form a semiconductor package with a package substrate having a TFC, an adhesive layer, according to some embodiments.

FIGS. 3A-3K are illustrations of cross-sectional views of a process flow to form a semiconductor package with a package substrate having a TFC, a bridge, a plurality of dies, and an encapsulation layer, according to some embodiments.

FIGS. 4A-4M are illustrations of cross-sectional views of a process flow to form a semiconductor package with a package substrate having a TFC, an adhesive layer, a plurality of BMVs, and a plurality of build-up layers, according to some embodiments.

DETAILED DESCRIPTION

Figure 1A:
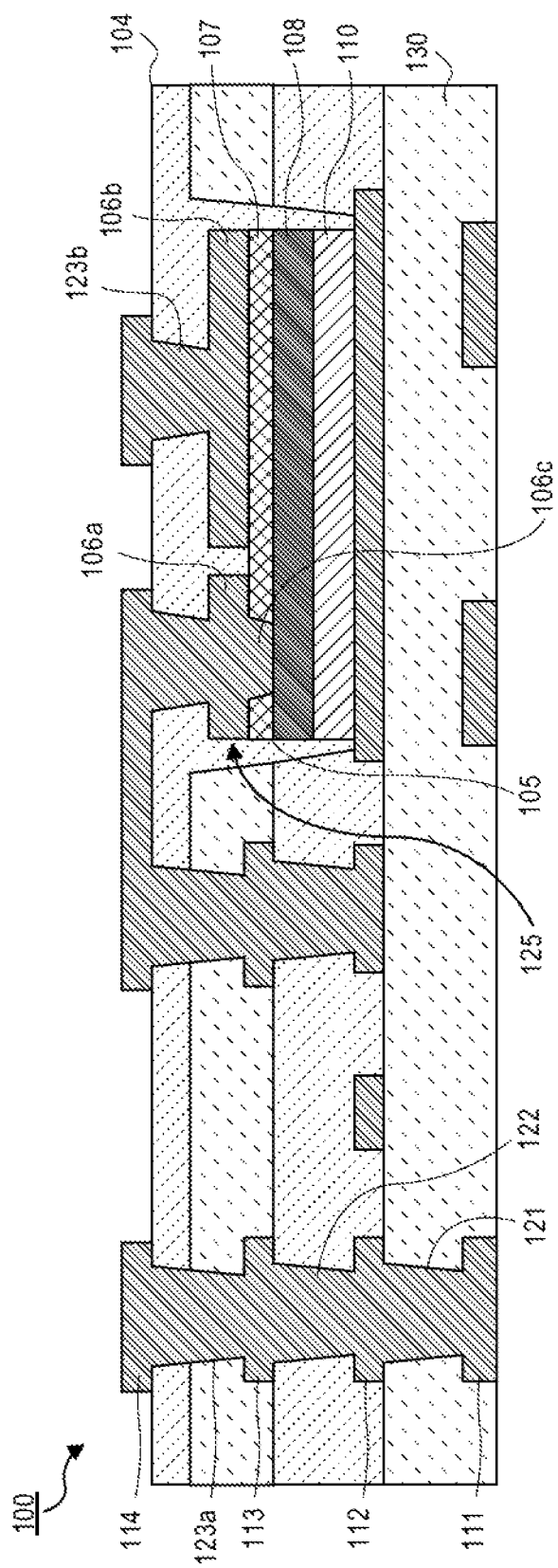
FIG. 1A is an illustration of a cross-sectional view of a semiconductor package with a package substrate having a thin film capacitor (TFC), an adhesive layer, and a plurality of build-up layers, according to one embodiment.

Described herein are semiconductor packages with embedded thin film capacitors (TFCs) and methods of forming such semiconductor packages. The semiconductor packages described below and methods of forming such semiconductor packages include embedding the TFCs in the upper build-up layers (e.g., the first level interconnects (FLIs)) of the package substrates. Embodiments of a semiconductor package described herein include patterning the through via(s) between the nickel (Ni) and copper (Cu) electrodes on a TFC, and then embedding (or incorporating) the TFC within the build-up layers and substantially proximate to the FLIs of the package substrate (e.g., a cored substrate, a coreless substrate, and/or any such organic substrate). As described herein, substantially proximate may refer to an embedded TFC that may be within approximately 5 um to 50 um of a FLI of a package substrate.

The embodiments of the semiconductor packages described herein improve packaging solutions by eliminating the bottleneck associated with vias in the package substrate. The embodiments described below also improve the performance of the semiconductor packages by substantially reducing the first droop impedance profile. Additionally, this enables implementing an increased number of package bins as the impedance profile of such packages have lower impedances with improved power performances. Embodiments of the semiconductor packages also enable patterning and incorporating TFCs within any type of build-up layers. For example, some of the methods described below enable patterning and coupling the TFC into the build-up layers of the package substrate from the top side of such package. Another advantage of the embodiments described herein include disposing the TFC within a proximate location that is near the interconnects of a die.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having embedded TFCs in the upper build-up layers of the package substrates (e.g., at or near the FLIs of the package substrate).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1B:
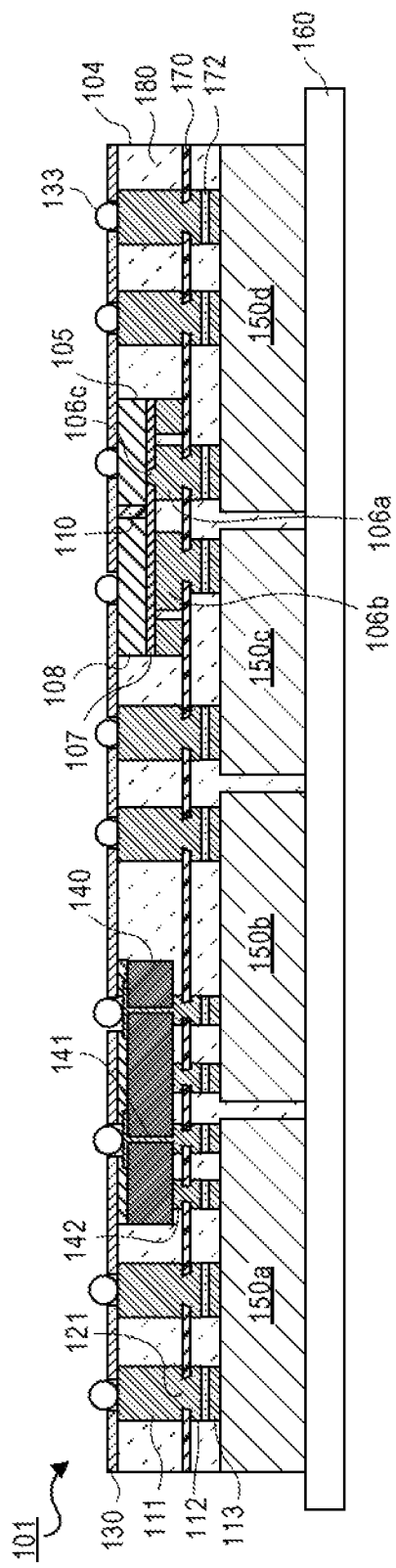
FIG. 1B is an illustration of a cross-sectional view of a semiconductor package with a package substrate having a TFC, a bridge, a plurality of dies, and an encapsulation layer, according to one embodiment.
Figure 1C:
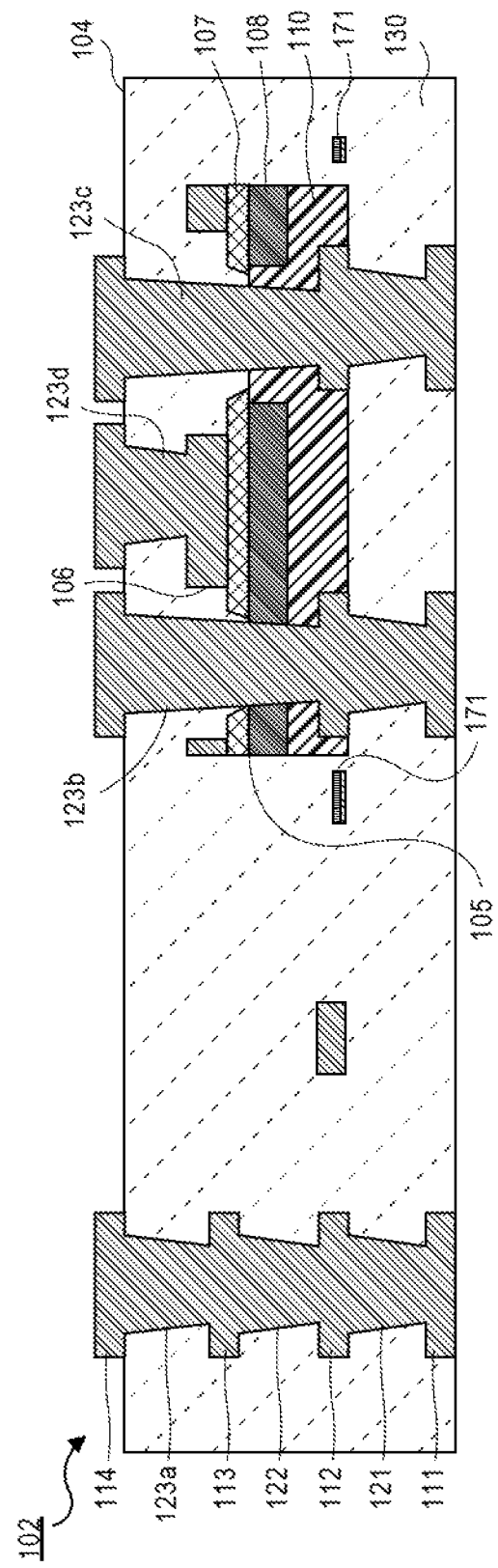
FIG. 1C is an illustration of a cross-sectional view of a semiconductor package with a package substrate having a TFC, an adhesive layer, a plurality of blind micro vias (BMVs), and a plurality of build-up layers, according to one embodiment.

FIGS. 1A-1C are a series of cross-sectional illustrations that depict a plurality of semiconductor packages 100-102, where each semiconductor package 100-102 has a TFC 105 embedded proximate to the FLIs of a package substrate 104 to reduce impedance (e.g., the first droop impedance of the semiconductor packages 100-102), in accordance with an embodiment. As described above, each of the FIGS. 1A-1C illustrate one of the approaches that enables embedding the TFC 105 within the upper build-up layers of the package substrate 104 to eliminate the bottleneck associated with vias in the package substrate 104, while substantially improving the first droop impedance profile of the respective semiconductor packages 100-102.

Referring now to FIG. 1A, a cross-sectional illustration of a semiconductor package 100 is shown, in accordance with an embodiment. In an embodiment, the semiconductor package 100 may include a package substrate 104. The package substrate 104 may include alternating layers of build-up layers 130 (or organic build-up layers) and conductive (e.g., copper) routing layers, such as conductive traces 111-114 and vias 121-123b, as is known in the art.

In an embodiment, a TFC 105 may be embedded in the package substrate 104. As described herein, a "TFC" may refer to a thin film capacitor that has a dielectric and conductive layers (or electrode layers). The TFC described herein may be patterned with a through via interconnect (e.g., the conductive layer 106a and via 106c) and a capacitor portion (e.g., the conductive layer 106b), where the through via interconnect (or the via) may couple the conductive/electrode layers while the capacitor portion does not impair (or damage) the dielectric. This enables a plug and play patterned TFC to be embedded into the top layers (e.g., at or near the FLIs) of the package substrate, as all the connections of the pattered TFC may be coupled (or accessed) from the top side of the package substrate.

For one embodiment, the TFC 105 may include a first electrode 106 (or electrode layer), a second electrode 108, and a dielectric 107 (or dielectric layer). As shown in FIG. 1A, the TFC 105 may dispose the first electrode 106 (e.g., a copper electrode) over the second electrode 108 (e.g., a nickel electrode), while the dielectric 107 (e.g., barium titanate (also referred to as barium titanium oxide) (BaTiO3) (BTO)) may be embedded (or disposed) between the first and second electrodes 106 and 108, according to one embodiment. In one embodiment, the first and second electrodes 106 and 108 may include copper, nickel, and/or any other conductive materials. For one embodiment, the dielectric 107 may be a dielectric layer having one or more dielectric materials, such as BTO.

For one embodiment, the first electrode 106 of the TFC 105 may include a plurality of pads 106a-b (or a plurality of first electrode pads) and a via 106c. The via 106c of the TFC 105 may be implemented to couple the first electrode 106 to the second electrode 108. Note that, as described herein, the first electrode 106 may include one or more first electrode conductive portions (e.g., the pads, traces, vias, etc.), yet the one or more first electrode portions 106a-c may be collectively referred to as the first electrode 106. That is, the term an electrode, such as the first electrode 106, may refer to either a single thin electrode layer of a TFC or a group of multiple electrode portions of a TFC.

In some embodiments, the dielectric 107 may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the dielectric 107 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In alternate embodiments, the dielectric 107 may be formed using dielectric materials having low-k dielectric materials. As used herein, a "low-k dielectric" refers to a material having a lower dielectric constant (k) than silicon oxide, where the terms "oxide," "carbide," "nitride," etc. refer to compounds containing, respectively, oxygen, carbon, nitrogen, etc. Examples of such dielectric materials that may be used include, but are not limited to, silicon dioxide, carbon doped oxide, silicon nitride, organic polymers such as perfluorocyclobutane or polytetrafluoroethylene, fluorosilicate glass, and/or organosilicates, such as silsesquioxane, siloxane, or organosilicate glass.

For some embodiments, the TFC 105 may have a thickness (or z-height) of approximately 15 um to 60 um. In one embodiment, the first electrode 106 may have a thickness of approximately 6 um to 25 um. In one embodiment, the second electrode 108 may have a thickness of approximately 8 um to 35 um. For example, in some embodiments, the first electrode 106 may have a thickness that is less than a thickness of the second electrode 108. In one embodiment, the dielectric 107 may have a thickness of approximately 1 nm to 5 nm. In other embodiments, the dielectric 107 may have a thickness of approximately 1 nm or greater.

In one embodiment, the TFC 105 may be embedded in a cavity 125 within the plurality of build-up layers 130. For one embodiment, the TFC 105 may be disposed on an adhesive layer 110 (or an adhesive film) in the bottom of the cavity 125, where the adhesive layer 110 may be disposed over/on the conductive layer 112. Note that, in an alternate embodiment, the TFC 105 may be embedded in the build-up layers 130 of the package substrate 104 without any adhesive layer and cavity. The build-up layers 130 may embed (or surround) the TFC 105, the adhesive layer 110, and the cavity 125, where the build-up layers 130 may be a stack of dielectrics (and/or any such similar materials). In one embodiment, the conductive layer 114 (or the conductive traces, pads, planes, etc.) may be the FLIs of the package substrate 104.

Accordingly, as shown in FIG. 1A, the conductive traces 106a-b (or conductive pads) of the first electrode 106 of the TFC 105 may be coupled to the FLIs 114 with the conductive vias 123b, enabling the TFC 105 to be substantially proximate to the FLIs 114 to improve the impedance profile of the semiconductor package 100, in accordance with an embodiment. Additionally, in some embodiments, the vias 123b may have a thickness that is less than a thickness of the vias 123a. In one embodiment, the first electrode 106a-b may have a top surface that is positioned above a top surface of the conductive layer 113.

Note that the semiconductor package 100 may include fewer or additional packaging components based on the desired packaging design.

Referring now to FIG. 1B, a cross-sectional illustration of a semiconductor package 101 with a plurality of dies 150a-d is shown, in accordance with an embodiment. In an embodiment, the semiconductor package 101 may be substantially similar to the semiconductor package 100 of FIG. 1A, with the exception that the conductive routing layers are surrounded with an encapsulation layer 180 (or a mold layer) that is disposed over and around the dies 150a-d.

In an embodiment, the semiconductor package 101 may include a package substrate 104. The package substrate 104 may include alternating layer(s) of encapsulation layer(s) 180, a photoimageable dielectric (PID) 170 (or a PID layer), a surface finish layer 172 (e.g., a copper and tin (CuSn) surface finish), and conductive (e.g., copper) routing layers, such as conductive layers/traces 111-113 and vias 121, as is known in the art. In one embodiment, the conductive layer 111 may include a plurality of pillars (e.g., copper pillars). In one embodiment, the encapsulation layer 180 may be a mold layer and/or any such similar encapsulation material(s). For one embodiment, the mold layer 180 may include an epoxy (e.g., a soft epoxy, a stiff epoxy, opaque epoxy, etc.) with one or more filler materials. In an embodiment, the mold layer 180 may be compression molded, laminated, or the like.

In some embodiments, the package substrate 104 may have the encapsulation layer 180 surround and embed a plurality of dies 150a-d, a bridge 140 (or a bridge substrate), and a TFC 105 over a carrier 160. In one embodiment, the carrier 160 may be a carrier formed of stainless steel, glass, and/or any other similar materials. In one embodiment, the dies 150a-d may include a microelectronic device, a semiconductor die, an integrated circuit (IC), a central processing unit (CPU), a microprocessor, a platform controller hub (PCH), a memory, and/or a field-programmable gate array (FPGA).

In an embodiment, the bridge 140 may be embedded in the package substrate 104. In an embodiment, the bridge 140 may be a silicon bridge or a bridge made of any other substrate material that is suitable for forming bridges. In one embodiment, the bridge 140 may be an embedded multi-die interconnect bridge (EMIB). In an embodiment, the bridge 140 may have a plurality of interconnects 141, where the plurality of interconnects 141 may be through silicon vias (TSVs). For some embodiments, the TSVs 141 of the bridge 140 may electrically couple one or more of the dies 150a-d and the conductive layer 112 (i.e., the FLIs) to a plurality of solder balls 133 (i.e., the mid-level interconnects (MLIs)) and other components and/or circuitry in the semiconductor package 101.

The TFC 105 may be substantially similar to the TFC 105 of FIG. 1A. For one embodiment, the TFC 105 may include a first electrode 106, a second electrode 108, and a dielectric 107. For one embodiment, the first electrode 106 of the TFC 105 may include a plurality of pads 106a-b and a via 106c, where the via 106c couples the first electrode 106 to the second electrode 108. For some embodiments, the TFC 105 may have a thickness of approximately 15 um to 60 um. In one embodiment, the first electrode 106 may have a thickness of approximately 6 um to 25 um. In one embodiment, the second electrode 108 may have a thickness of approximately 8 um to 35 um. For example, in some embodiments, the first electrode 106 may have a thickness that is less than a thickness of the second electrode 108. In one embodiment, the dielectric 107 may have a thickness of approximately 1 nm to 5 nm. In other embodiments, the dielectric 107 may have a thickness of approximately 1 nm or greater.

For one embodiment, the TFC 105 may be disposed on an adhesive layer 110 that couples a bottom surface(s) of the TFC 105 to a dielectric 130 (or a solder resist layer). In one embodiment, the conductive layer 112 may be the FLIs of the package substrate 104. Accordingly, for one embodiment, the conductive traces 106a-b of the first electrode 106 of the TFC 105 may be coupled to the FLIs 112 with the conductive vias 121, enabling the TFC 105 to be substantially proximate to the FLIs 112 to improve the impedance profile of the semiconductor package 101.

Note that the semiconductor package 101 may include fewer or additional packaging components based on the desired packaging design.

Referring now to FIG. 1C, a cross-sectional illustration of a semiconductor package 102 is shown, in accordance with an embodiment. In an embodiment, the semiconductor package 102 may be substantially similar to the semiconductor package 100 of FIG. 1A, with the exception that an etch stop layer 171 is embedded in the build-up layers 130 of the package substrate 104, and conductive traces 112 and 114 are coupled with a plurality of vias 123b-c which are disposed through the TFC 105.

In an embodiment, the semiconductor package 102 may include a package substrate 104. The package substrate 104 may include alternating layers of build-up layers 130 and conductive (e.g., copper) routing layers, such as conductive traces 111-114 and vias 121-123d, as is known in the art. In an embodiment, a TFC 105 may be embedded in the package substrate 104. In one embodiment, the TFC 105 may be embedded in the plurality of build-up layers 130. For one embodiment, the TFC 105 may be disposed on an adhesive layer 110, where the adhesive layer 110 may be disposed on/over the conductive layer 112.

The TFC 105 may be substantially similar to the TFC 105 of FIG. 1A. For one embodiment, the TFC 105 may include a first electrode 106, a second electrode 108, and a dielectric 107. For one embodiment, the vias 123b-c may be disposed (or formed) through the TFC 105. The vias 123b-c may couple the conductive layer 112 to the conductive layer 114, where the via 123b may be coupled to the first and second electrodes 106 and 108 while the via 123c may be insulated from the electrodes of the TFC 105 with the adhesive layer 110. In one embodiment, the vias 123b-c may have a thickness that is approximately 60 um to 70 um. In an embodiment, the vias 123b-c may have a thickness that is greater than a thickness of the vias 123a and 123d. For one embodiment, the via 123a may have a thickness that is approximately greater than a thickness of the via 123d.

For some embodiments, the TFC 105 may have a thickness of approximately 15 um to 60 um. In one embodiment, the first electrode 106 may have a thickness of approximately 6 um to 25 um. In one embodiment, the second electrode 108 may have a thickness of approximately 8 um to 35 um. For example, in some embodiments, the first electrode 106 may have a thickness that is less than a thickness of the second electrode 108. In one embodiment, the dielectric 107 may have a thickness of approximately 1 nm to 5 nm. In other embodiments, the dielectric 107 may have a thickness of approximately 1 nm or greater.

In one embodiment, the conductive layer 114 may be the FLIs of the package substrate 104. Accordingly, for one embodiment, the first electrode 106 of the TFC 105 may be coupled to the FLIs 114 with one or more of the conductive vias 123a-b, enabling the TFC 105 to be substantially proximate to the FLIs 114 to improve the impedance profile of the semiconductor package 102.

Note that the semiconductor package 102 may include fewer or additional packaging components based on the desired packaging design.

Referring now to FIGS. 2A-2E, a series of cross-sectional illustrations illustrating a process for forming a semiconductor package 200 substantially similar to the semiconductor package 100 of FIG. 1A is shown, in accordance with an embodiment. As described above, FIGS. 2A-2E illustrate one of the approaches that enables the semiconductor package 200 to embed a TFC 205 in a plurality of build-up layers 230 of a package substrate 205, where the embedded TFC 205 may be patterned and positioned substantially proximate to FLIs 214 of the package substrate 204, thereby eliminating the need to drill through the TFC 205 during the substrate manufacturing as the TFC connections (e.g., the conductive traces 206a-b of the TFC 205 as shown in FIG. 2E) may be coupled from the top side of the package substrate 204.

Figure 2A:
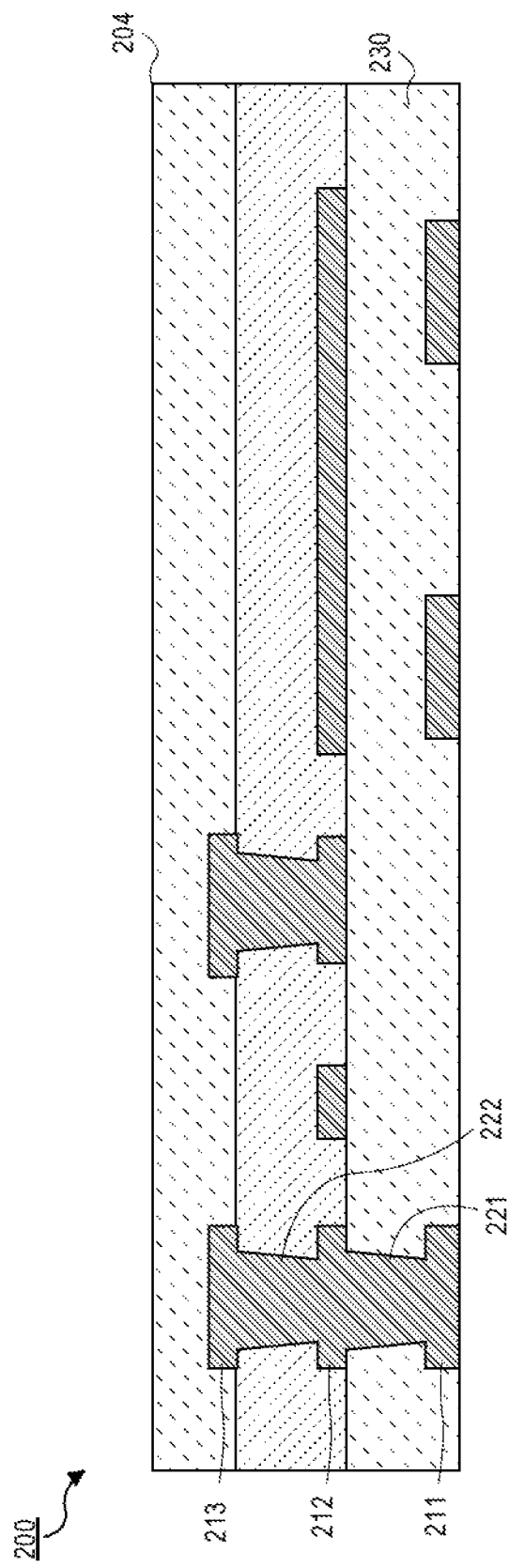

Referring now to FIG. 2A, a cross-sectional illustration of a semiconductor package 200 with a package substrate 204 is shown, in accordance with an embodiment. In one embodiment, the package substrate 204 may include a plurality of build-up layers 230, a plurality of conductive layers 211-213, and a plurality of vias 221-222. The build-up layers 230 may be a stack of dielectrics. The illustrated build-up layers 230 are shown as having alternating dielectric build-up layers for simplicity (i.e., the illustrated dielectrics 230 having alternating patterned layers), yet those skilled in the art will recognize that the build-up layers 230 may include a plurality of single dielectric build-up layers formed of the same material. The conductive layers 211-213 may include conductive traces, pads, planes, and so on, that are disposed in the build-up layers 230, where the conductive layers 211-213 are coupled with the vias 221-222. In an embodiment, the conductive layers 211-213 and the vias 221-222 may be formed with an electroplating process or the like.

Referring now to FIG. 2B, a cross-sectional illustration after a cavity 225 is formed through the build-up layers 230 of the package substrate 204 is shown, in accordance with an embodiment. In one embodiment, the cavity 225 may be an opening that is patterned in the build-up layers 230, where the opening exposes a portion of the conductive layers 212. In an embodiment, the cavity 225 may be patterned with a lithographic process, a laser drilling process, or the like.

Referring now to FIG. 2C, a cross-sectional illustration after a TFC 205 is disposed in the cavity 225 of the package substrate 204 is shown, in accordance with an embodiment. In one embodiment, the TFC 205 may be substantially similar to the TFC 105 described above with respect to FIG. 1A. The TFC 205 may include a first electrode 206a-b (e.g., a copper electrode), a second electrode 208 (e.g., a nickel electrode), and a dielectric 207 (e.g., a BTO dielectric). For one embodiment, the TFC 205 may be initially patterned to enable the first electrode 206a-b to have patterned electrode connections that may be coupled from the top side of the package substrate 204, eliminating the need to drill through the TFC 205 during the substrate manufacturing process.

In an embodiment, the cavity 225 may have an adhesive layer 210 disposed on the exposed portion of the conductive layer 212 that allows the TFC 205 to adhere to the conductive layer 212. In an embodiment, the TFC 205 may be placed on the adhesive layer 210 in the cavity 225 with a pick-and-place tool or the like. In an alternative embodiment, an uncured dielectric (not shown) may be disposed over the build-up layers 230 rather than forming a cavity, and the TFC 205 may be subsequently pressed into the uncured dielectric of the build-up layers 230 with a pressing tool.

For one embodiment, a via 206c may be disposed (or formed) through the dielectric 207 to couple the first electrode 206 to the second electrode 208. For some embodiments, the TFC 205 may have a thickness of approximately 15 um to 60 um. In one embodiment, the first electrode 206 may have a thickness of approximately 6 um to 25 um. In one embodiment, the second electrode 208 may have a thickness of approximately 8 um to 35 um. For example, in some embodiments, the first electrode 206 may have a thickness that is less than a thickness of the second electrode 208. In one embodiment, the dielectric 207 may have a thickness of approximately 1 nm to 5 nm. In other embodiments, the dielectric 207 may have a thickness of approximately 1 nm or greater.

Referring now to FIG. 2D, a cross-sectional illustration after a dielectric is disposed over the build-up layers 230 and the TFC 205 in the cavity 225 is shown, in accordance with an embodiment. In one embodiment, the dielectric 230 may be disposed over a top portion of the build-up layers, including the cavity 225. The dielectric 230 may embed the TFC 205 in the build-up layers 230.

Referring now to FIG. 2E, a cross-sectional illustration after a conductive layer 214 and vias 223a-b are disposed over the TFC 205 and the build-up layers 230 is shown, in accordance with an embodiment. In one embodiment, the conductive layer 214 and the vias 223a-b are disposed (or formed) on/in the build-up layers 230 of the package substrate 204. The conductive layer 214 may be coupled to the conductive layer 213 and the first electrode 206a-b of the TFC 205 with the vias 223a-b. In an embodiment, the conductive layer 214 and the vias 223a-b may be formed with an electroplating process.

In one embodiment, the conductive layer 214 may be the FLIs of the package substrate 204. Accordingly, in some embodiments, the first electrode 206a-b of the TFC 205 may be coupled to the FLIs 214 with the conductive vias 223b, enabling the TFC 205 to be substantially proximate to the FLIs 214 to improve the impedance profile of the semiconductor package 200, in accordance with an embodiment. Additionally, in some embodiments, the vias 223b may have a thickness that is less than a thickness of the vias 223a. In one embodiment, the first electrode 206a-b may have a top surface that is positioned above a top surface of the conductive layer 213.

Note that the semiconductor package 200 of FIGS. 2A-2E may include fewer or additional packaging components based on the desired packaging design.

Referring now to FIGS. 3A-3K, a series of cross-sectional illustrations illustrating a process for forming a semiconductor package 300 substantially similar to the semiconductor package 101 of FIG. 1B is shown, in accordance with an embodiment. As described above, FIGS. 3A-3K illustrate one of the approaches that enables the semiconductor package 300 to embed a TFC 305 in an encapsulation layer 380 of a package substrate 304, where the embedded TFC 305 may be patterned and positioned substantially proximate to FLIs 312 that are coupled to a plurality of dies 350a-d that are disposed over the package substrate 304.

Figure 3A:
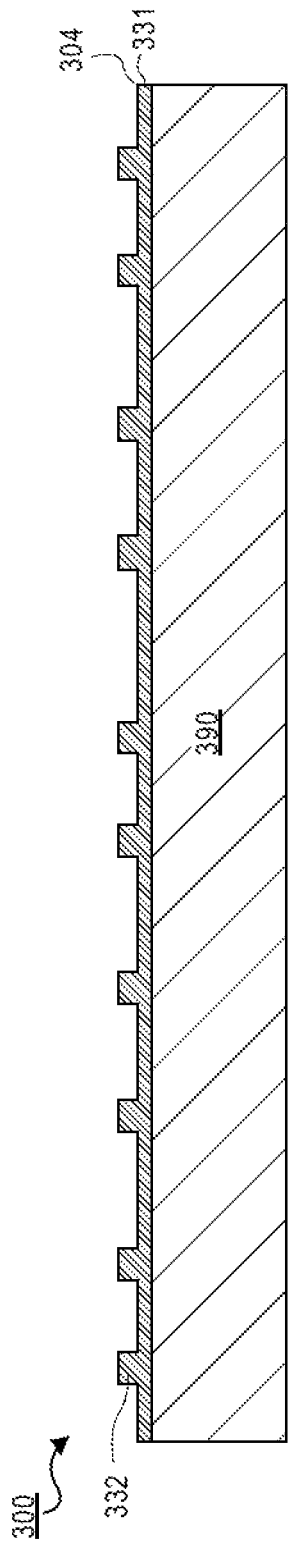

Referring now to FIG. 3A, a cross-sectional illustration of a seed layer 331 over a glass carrier 390 is shown, in accordance with an embodiment. In an embodiment, the seed layer 331 may be disposed over the glass carrier 390 to enable MLIs that may be formed in a subsequent assembly operation (e.g., as shown below with the solder bumps 333 of FIG. 3K that implement the MLIs of the semiconductor package 300). In one embodiment, the seed layer 331 may be copper, titanium, or the like. In an embodiment, the seed layer 331 may be formed with a sputtering process or the like. In one embodiment, a plurality of bumps 332 (or via bumps) may be disposed (or plated) over the seed layer 331, where the bumps 332 may be copper via bumps that may be formed with an electroplating process or the like.

Figure 3B:
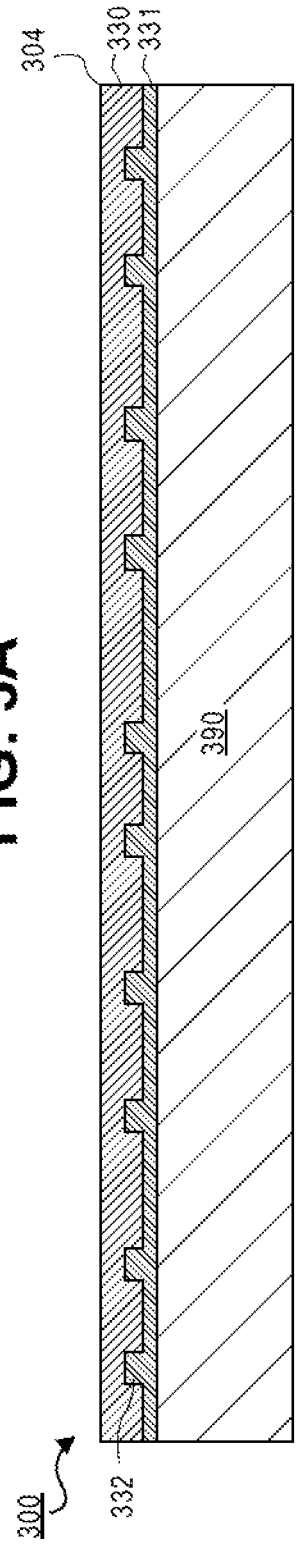

Referring now to FIG. 3B, a cross-sectional illustration after a dielectric 330 is disposed over the seed layer 331 and bumps 332 is shown, in accordance with an embodiment. In one embodiment, the dielectric 330 may be laminated over the seed layer 331 and the bumps 332, where the dielectric 330 may cover and extend over the top surfaces of the bumps 332.

Figure 3C:
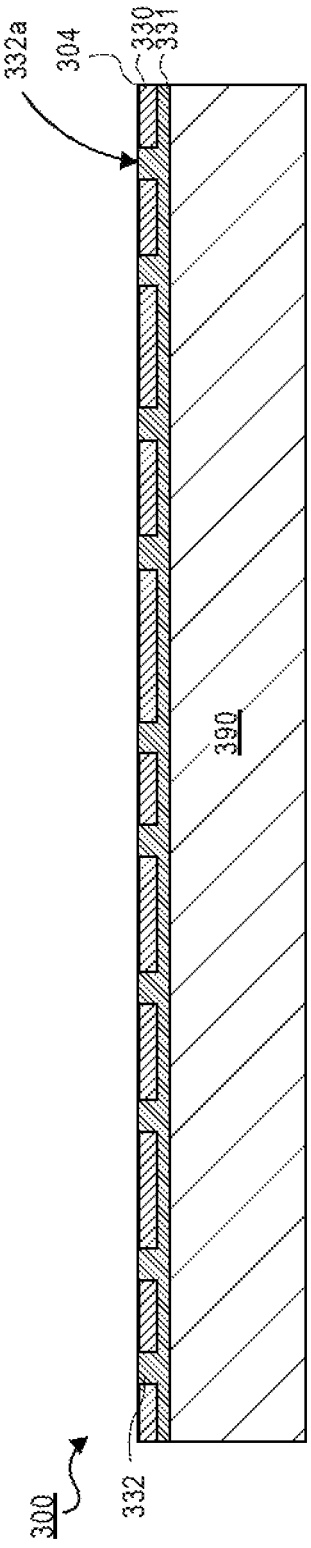

Referring now to FIG. 3C, a cross-sectional illustration after a planarization process is implemented to expose top surfaces 332a of the via bumps 332 is shown, in accordance with an embodiment. In an embodiment, the excess dielectric 330 may be planarized so that the top surfaces 332a of the vias bumps 332 are substantially coplanar with a top surface of the dielectric 330. In an embodiment, the excess dielectric 330 may be removed with a laser ablation, a dry etch, or the like.

Figure 3D:
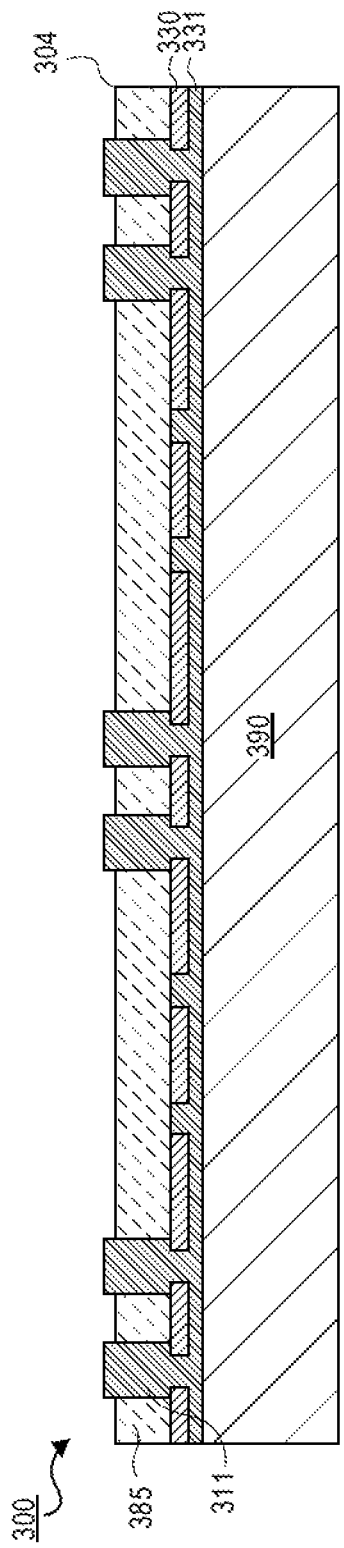

Referring now to FIG. 3D, a cross-sectional illustration after a resist layer 385 is disposed over the dielectric 330 and exposed via bumps 332a and patterned is shown, in accordance with an embodiment. In an embodiment, the resist layer 385 may be a dry-film resist (DFR) or the like. In an embodiment, the resist layer 385 may be patterned to form via openings with a lithographic process, a laser drilling process, or the like. The via openings may expose one or more of the top surfaces of the via bumps over the seed layer 331, while covering the other top surfaces of the via bumps. The via openings may also expose portions (or surfaces) of the dielectric 330.

In some embodiments, a plurality of pillars 311 may be disposed (or plated/formed) over the one or more exposed top surfaces of the via bumps. The plurality of pillars 311 may be referred to as a first conductive layer of the package substrate 304. In an embodiment, the pillars 311 may be over-plated over the top surface of the resist layer 385 in order to ensure complete filling of the via openings in the resist layer 385. For one embodiment, the pillars 311 may disposed over the via bumps and portions of the dielectric 330. In an embodiment, the pillars 311 may be formed with an electroplating process.

Figure 3E:
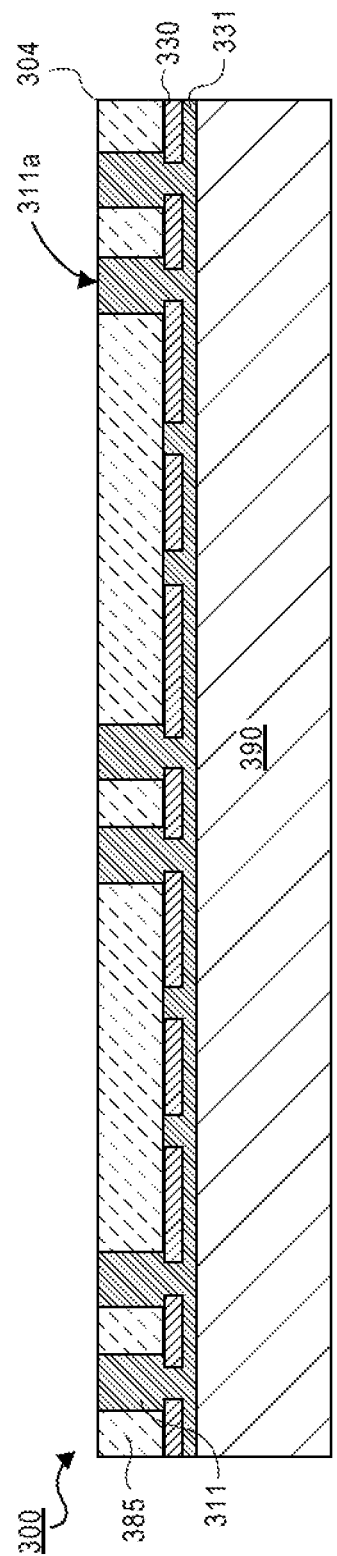

Referring now to FIG. 3E, a cross-sectional illustration after a planarization process is implemented to expose top surfaces 311a of the pillars 311 is shown, in accordance with an embodiment. In an embodiment, the over-plated pillars 311 may be planarized so that the top surfaces 311a of the pillars 311 are substantially coplanar with a top surface of the resist layer 385. This planarization process also enables the pillars 311 to have substantially the same thickness, thereby reducing the thickness variation of the package substrate 304. In an embodiment, the planarization may be implemented with a chemical mechanical planarization (CMP) process or the like. The planarization process may have a high degree of accuracy due to the presence of the resist layer 385 that serves as a stopping point Referring now to FIG. 3F, a cross-sectional illustration after the resist layer is stripped, and a TFC 305 and a bridge 340 are disposed over the dielectric 330 is shown, in accordance with an embodiment. In an embodiment, the resist layer may be stripped with any suitable process, such as ashing, wet stripping, or the like. After removing the resist layer, the remaining via bumps may be exposed.

For some embodiments, the TFC 305 may be disposed over the dielectric 330. In one embodiment, the TFC 305 may be substantially similar to the TFC 105 described above with respect to FIG. 1B. The TFC 305 may include a first electrode 306a-b (e.g., a copper electrode), a second electrode 308 (e.g., a nickel electrode), and a dielectric 307 (e.g., a BTO dielectric). For one embodiment, the TFC 305 may be initially patterned to enable the first electrode 306a-b to have patterned electrode connections that may be coupled substantially proximate to FLIs that may be formed in a subsequent assembly operation (e.g., as shown below with the FLIs 312 of FIG. 3K). For example, the TFC 305 may be patterned with a through via interconnect portion 305a and a capacitor portion 305b. The through via interconnect portion 305a may include a first electrode pad 306a coupled to the second electrode 308 with a via 306c, where the via 306c is disposed through the dielectric 307. The capacitor portion 305b may include a first electrode trace/pad 306b over the second electrode 308, while the dielectric 307 is disposed (or sandwiched) between the first electrode 306b and the second electrode 308 as not to impair (or damage) the dielectric 307.

In an embodiment, the package substrate 304 may have an adhesive layer 310 disposed over the dielectric 330 that allows the TFC 305 to adhere to the dielectric 330. In an embodiment, the TFC 305 may be placed on the adhesive layer 310 over the dielectric 330 with a pick-and-place tool or the like. For some embodiments, the TFC 305 may have a thickness of approximately 15 um to 60 um. In one embodiment, the first electrode 306 may have a thickness of approximately 6 um to 25 um. In one embodiment, the second electrode 308 may have a thickness of approximately 8 um to 35 um. For example, in some embodiments, the first electrode 306 may have a thickness that is less than a thickness of the second electrode 308. In one embodiment, the dielectric 307 may have a thickness of approximately 1 nm to 5 nm. In other embodiments, the dielectric 307 may have a thickness of approximately 1 nm or greater.

In an embodiment, the bridge 340 may be embedded in the package substrate 304. The bridge 340 may be substantially similar to the bridge 140 of FIG. 1B. In one embodiment, the bridge 340 may be an EMIB. In an embodiment, the bridge 340 may have a plurality of interconnects 341, where the plurality of interconnects 341 may be TSVs. For some embodiments, the TSVs 341 of the bridge 340 may electrically couple one side of the bridge 340 on the dielectric 330 to conductive pads 342 on the opposite side of the bridge 340, where the TSVs 341 of the bridge 340 may subsequently couple FLIs to MLIs formed in subsequent operations, and other components and/or circuitry in the package substrate 304 of the semiconductor package 300.

Referring now to FIG. 3G, a cross-sectional after an encapsulation layer 380 is disposed over the pillars 311, the dielectric 330, the TFC 305, and the bridge 340 is shown, in accordance with an embodiment. In one embodiment, the encapsulation layer 380 may be disposed to cover the top surfaces of the pillars 311. In one embodiment, the encapsulation layer 380 may be a mold layer and/or any similar encapsulation material(s). For one embodiment, the mold layer 380 may include an epoxy (e.g., a soft epoxy, a stiff epoxy, opaque epoxy, etc.) with one or more filler materials. In an embodiment, the encapsulation layer 380 may be compression molded, laminated, or the like.

Referring now to FIG. 3H, a cross-sectional illustration after a planarization process is implemented to expose top surfaces of the pillars 311, a PID layer 370 is disposed and patterned over the encapsulation layer 380, and a conductive layer 312 (or FLI) and a surface finish 372 disposed on the pillars 311 is shown, in accordance with an embodiment. In an embodiment, the encapsulation layer 380 may be planarized so that the top surfaces of the pillars 311 are substantially coplanar with a top surface of the encapsulation layer 380. In an embodiment, the planarization may be implemented with a CMP process or the like.

In an embodiment, the PID layer 370 may be disposed over the encapsulation layer 380 and the pillars 311. For one embodiment, the PID layer 370 may be a high-dose sensitive, positive-tone PID. For another embodiment, the PID layer 370 may be a low-dose sensitive, negative-tone PID. For one embodiment, the PID layer 370 may be deposited with a lamination, spray coating, spin coating, ink-jet printed, or other known deposition methods.

In an embodiment, the FLIs may be implemented as the conductive layer 312 that is coupled to the pillars 311 with vias 321. For one embodiment, the surface finish layer 372 may be disposed on the conductive layer 312, where the surface finish layer 372 may include copper and tin (or the like).

Referring now to FIG. 3I, a cross-sectional illustration after a plurality of dies 350a-d are disposed over the FLIs 312 is shown, in accordance with an embodiment. In one embodiment, the dies 350a-d may have conductive pads 313 that electrically coupled the dies 350a-d to the FLIs 312 and the surface finish 372. In one embodiment, the encapsulation layer 380 may further surround the FLIs 312, the surface finish layer 372, and the dies 350a-d. In one embodiment, the encapsulation layer 380 may also be disposed between each of the dies 350a-d. In one embodiment, the dies 350a-d may include a microelectronic device, a semiconductor die, an IC, a CPU, a microprocessor, a PCH, a memory, and/or a FPGA. The dies 350a-d may be electrically coupled to the embedded bridge 340 and/or the embedded TFC 305.

Referring now to FIG. 3J, a cross-sectional illustration after the glass carrier is removed and a carrier 360 is disposed below the dies 350a-d is shown, in accordance with an embodiment. For one embodiment, the package substrate 304 may be flipped over to dispose the dies 350a-d over the carrier 360 (i.e., the carrier 360 is coupled to the die side of the dies 350a-d). In one embodiment, the carrier 360 may be a carrier formed of stainless steel, glass, and/or any other similar materials.

In one embodiment, the seed layer and the via bumps may be removed to form openings 326 through the dielectric 330 and over the bottom surfaces of the pillars 311, the TFC 305, and/or the bridge 340. The openings 326 may be formed to expose conductive surfaces for the pillars 311 the TFC 305, and/or the bridge 340 to subsequently form the MLIs as shown below in FIG. 3K. In one embodiment, the seed layer and via bumps may be removed with an etching process (e.g., a flash etch) or the like. For an additional embodiment, a surface finish layer (not shown) may be disposed over the openings 326 if needed, where the TFC 305 may be initially patterned to enable a conductive/copper plating on the second electrode 308 (or the nickel electrode) if the surface finish layer is disposed.

Referring now to FIG. 3K, a cross-sectional illustration after a plurality of solder balls 333 are disposed to form the MLIs of the package substrate 304 is shown, in accordance with an embodiment. In one embodiment, the solder balls 333 may be coupled to the pillars 311, the bridge 340, and/or the TFC 305, enabling the package substrate 304 to implement the solder balls 333 as the MLIs to subsequently couple the package substrate 304 to another substrate.

Note that the semiconductor package 300 of FIGS. 3A-3K may include fewer or additional packaging components based on the desired packaging design.

Referring now to FIGS. 4A-4M, a series of cross-sectional illustrations illustrating a process for forming a semiconductor package 400 substantially similar to the semiconductor package 102 of FIG. 1C is shown, in accordance with an embodiment. As described above, FIGS. 4A-4M illustrate one of the approaches that enables the semiconductor package 400 to embed a TFC 405 in a plurality of build-up layers 430 of a package substrate 404, where the embedded TFC 405 may be patterned and positioned substantially proximate to FLIs 414 of the package substrate 404.

Referring now to FIG. 4A, a cross-sectional illustration of a conductive layer 412 and a seed layer 412a disposed over a build-up layer 430, a plurality of vias 421, and a conductive layer 411 is shown, in accordance with an embodiment. In one embodiment, a package substrate 404 may include the build-up layer(s) 430, the conductive layers 411-412, and the vias 421. The build-up layer(s) 430 may be a stack of dielectrics. The illustrated build-up layers 430 (as shown in FIG. 4M) is shown as having a single dielectric build-up layer 430 for simplicity, and those skilled in the art will recognize that the single dielectric build-up layer 430 may include a plurality of build-up layers 430.

The build-up layer 430 may include a plurality of conductive layers 411-412 and vias 421, as is known in the art. The conductive layers 411-412 may include conductive traces, pads, planes, and so on, that are disposed in/on the build-up layers 430, where the conductive layers 411-412 are coupled with the vias 421. In an embodiment, the conductive layers 411-412 and the vias 421 may be formed with an electroplating process or the like. In an embodiment, the seed layer 412a may remain disposed over the build-up layer to facilitate with a cavity that may be formed in a subsequent assembly operation (e.g., as shown below with the cavity 425 of FIG. 4F). In one embodiment, the seed layer 412a may be copper, titanium, or the like. In an embodiment, the seed layer 412a may be formed with a sputtering process or the like.

Referring now to FIG. 4B, a cross-sectional illustration after a resist layer 485 is disposed over the seed layer 412a and the conductive layer 412 and patterned is shown, in accordance with an embodiment. In an embodiment, the resist layer 485 may be a DFR or the like. In an embodiment, the resist layer 485 may be patterned to form an opening 424 with a lithographic process, or with a laser drilling process. In an embodiment, the opening 424 exposes portions of the seed layer 412a and the conductive layer 412 through the resist layer 485, while blocking the other portions of the seed layer 412a and the conductive layer 412.

Referring now to FIG. 4C, a cross-sectional illustration after a conductive layer 471 is disposed over the exposed seed layer 412a and the conductive layer 412 in the opening 424 is shown, in accordance with an embodiment. In one embodiment, the conductive layer 471 may be a nickel layer or the like. The conductive layer 471 may be disposed into the opening 424 to act as a laser stop layer in a subsequent assembly operation. The conductive layer 471 may be disposed with a sputtering process or the like. In one embodiment, the conductive layer 471 may have a thickness that is approximately 8 um to 12 um.

Referring now to FIG. 4D, a cross-sectional illustration after the resist layer is removed and a dielectric 430 disposed over the conductive layers 412 and 471 is shown, in accordance with an embodiment. In an embodiment, the resist layer may be stripped with any suitable process, such as ashing, wet stripping, or the like. In an embodiment, after the resist layer is stripped, the seed layer 412a may have an exposed portion that may be removed with an etching process (e.g., a flash etch), while a covered portion of the seed layer 412a remains covered by the conductive layer 471. In an embodiment, after the exposed seed layer is etched, a dielectric 430 may be disposed over the initial build-up layer 430 and the conductive layers 412 and 471. In an embodiment, the dielectric 430 may be compression molded, laminated, or the like. The dielectric 430 may embed the conductive layer 471 in the build-up layers 430.

Referring now to FIG. 4E, a cross-sectional illustration after a conductive layer 413 and a via 422 are disposed in the build-up layers 430 is shown, in accordance with an embodiment. In an embodiment, the conductive layer 413 and the via 422 may be disposed (or formed/plated) with a semi-additive process (SAP) or the like.

Figure 4F:
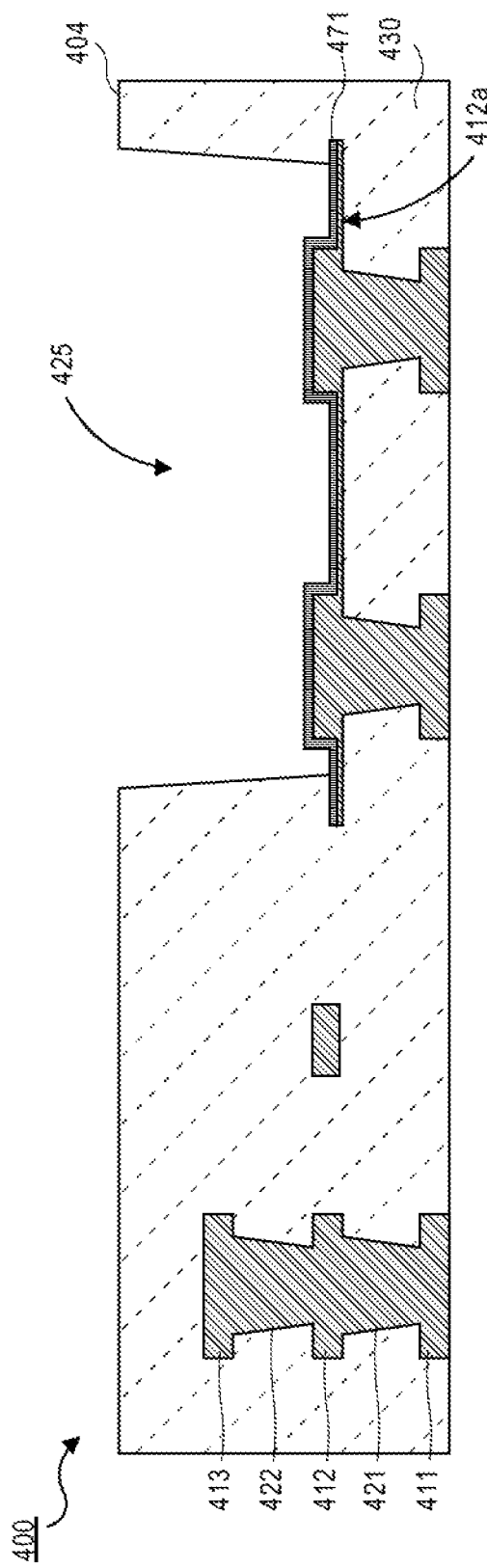

Referring now to FIG. 4F, a cross-sectional illustration after a cavity 425 is formed through the build-up layers 430 is shown, in accordance with an embodiment. In one embodiment, the cavity 425 may be an opening that is patterned through the build-up layers 430, where the cavity 425 exposes a portion of the conductive layer 471 that acts as an etch stop layer for the laser-drilling process (or the like). In an embodiment, the cavity 425 may be patterned with a lithographic process, a laser drilling process, or the like. Note that, as shown in FIG. 4F, the build-up layers 430 may cover one or more portions of the conductive layer 471 while the cavity 425 exposes the other portion of the conductive layer 471.

Figure 4G:
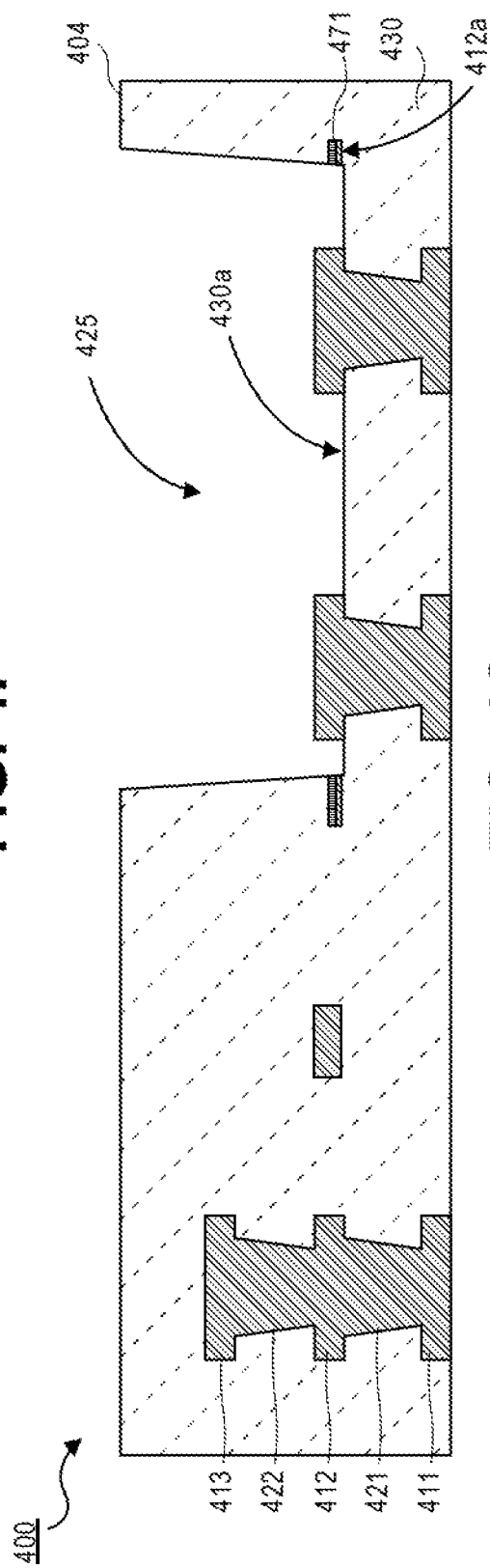

Referring now to FIG. 4G, a cross-sectional illustration after the exposed portion of the conductive layer 471 is removed, and a surface 430a of the build-up layers 430 is exposed is shown, in accordance with an embodiment. In one embodiment, the exposed portion of the conductive layer 471 may be removed with an etching process. In an embodiment, a portion of the seed layer 412a may also be removed, where the removed portion of the seed layer 412a is the portion that was covered by the exposed portion of the conductive layer 471. Likewise, in one embodiment, the portion of the seed layer 412a may be removed with an etching process. Note that, as shown in FIG. 4G, the build-up layers 430 may cover one or more portions of the conductive layer 471 and the seed layer 412a, while the cavity 425 exposes one or more pads of the conductive layer 412 and the surface 430a of the build-up layers 430.

Referring now to FIG. 4H, a cross-sectional illustration after a TFC 405 is disposed in the cavity 425 is shown, in accordance with an embodiment. In one embodiment, the TFC 405 may be substantially similar to the TFC 105 described above with respect to FIG. 1C. The TFC 405 may include a first electrode 406 (e.g., a copper electrode), a second electrode 408 (e.g., a nickel electrode), and a dielectric 407 (e.g., a BTO dielectric). For one embodiment, the TFC 405 may be initially patterned to enable the first electrode 406 to be coupled to the second electrode 408.

In an embodiment, the cavity 425 may have an adhesive layer 410 disposed on the exposed portion of the conductive layer that allows the TFC 405 to adhere to the conductive layer 412. In one embodiment, the adhesive layer 410 may be patterned to adhere to the conductive layer 412 and the patterned shape of the second electrode 408 of the TFC 405. In an embodiment, the TFC 405 may be placed on the adhesive layer 410 in the cavity 425 with a pick-and-place tool or the like.

For some embodiments, the TFC 405 may have a thickness of approximately 15 um to 60 um. In one embodiment, the first electrode 406 may have a thickness of approximately 6 um to 25 um. In one embodiment, the second electrode 408 may have a thickness of approximately 8 um to 35 um. For example, in some embodiments, the first electrode 406 may have a thickness that is less than a thickness of the second electrode 408. In one embodiment, the dielectric 407 may have a thickness of approximately 1 nm to 5 nm. In other embodiments, the dielectric 407 may have a thickness of approximately 1 nm or greater.

Referring now to FIG. 4I, a cross-sectional illustration after openings 426a-b are formed through the TFC 405 is shown, in accordance with an embodiment. In one embodiment, the TFC 405 may be patterned to form the openings 426a-b through the first electrode 406 and the dielectric 407. The opening 426a may be formed through the first electrode 406 and the dielectric 407 to expose a portion (or surface) of the second electrode 408. The opening 426b may be formed through the first electrode 406 and the dielectric 407 to expose a portion (or surface) of the adhesive layer 410. In one embodiment, the openings 426a-b may be formed by disposing and patterning a resist layer (not shown) over the TFC 405 in the cavity 425.

Referring now to FIG. 4J, a cross-sectional illustration after a dielectric 430 is disposed over the TFC 405 is shown, in accordance with an embodiment. In one embodiment, the dielectric 430 may be disposed over the initial build-up layers 430 and in the cavity as to fill the cavity and embed the TFC 405 in the build-up layers 430. Additionally, the build-up layers 430 may now fill the openings formed through the first electrode 406 and the dielectric 407 of the TFC 405. In an embodiment, the dielectric 430 may be compression molded, laminated, or the like.

Referring now to FIG. 4K, a cross-sectional illustration after openings 427a-b are formed through the build-up layers 430 and the TFC 405 is shown, in accordance with an embodiment. In one embodiment, the openings 427a-b may be patterned with a lithographic process, a laser drilling process, or the like. In an embodiment, the openings 427a-b may be laser drilled via openings formed through the build-up layers 430 and the second electrode 408 of the TFC 405 to expose one or more top surfaces of the conductive layer 412.

Referring now to FIG. 4L, a cross-sectional illustration after a conductive layer 414 and vias 423b-c are disposed over and through the build-up layers 430 and the TFC 405 is shown, in accordance with an embodiment. In an embodiment, the conductive layer 414 and the vias 423b-c may be formed with an electroplating process or the like. In one embodiment, the vias 423b-c may be copper plated blind micro vias (BMVs) that couple the conductive layer 414 to the pads of the conductive layer 412 in the adhesive layer 410.

Referring now to FIG. 4M, a cross-sectional illustration after vias 423a and 423d are disposed through the build-up layers 430 is shown, in accordance with an embodiment. In an embodiment, the vias 423a and 423d may be formed with an electroplating process or the like. In one embodiment, the vias 423a may couple the conductive layer 414 to the conductive layer 413, and the vias 423d may couple the conductive layer 414 to the first electrode 406 of the TFC 405. In one embodiment, the vias 423b-c may have a thickness that is approximately 60 um to 70 um. In an embodiment, the vias 423b-c may have a thickness that is greater than a thickness of the vias 423a and 423d. For one embodiment, the via 423a may have a thickness that is approximately greater than a thickness of the via 423d.

Note that the semiconductor package 400 of FIGS. 4A-4M may include fewer or additional packaging components based on the desired packaging design.

Figure 5:
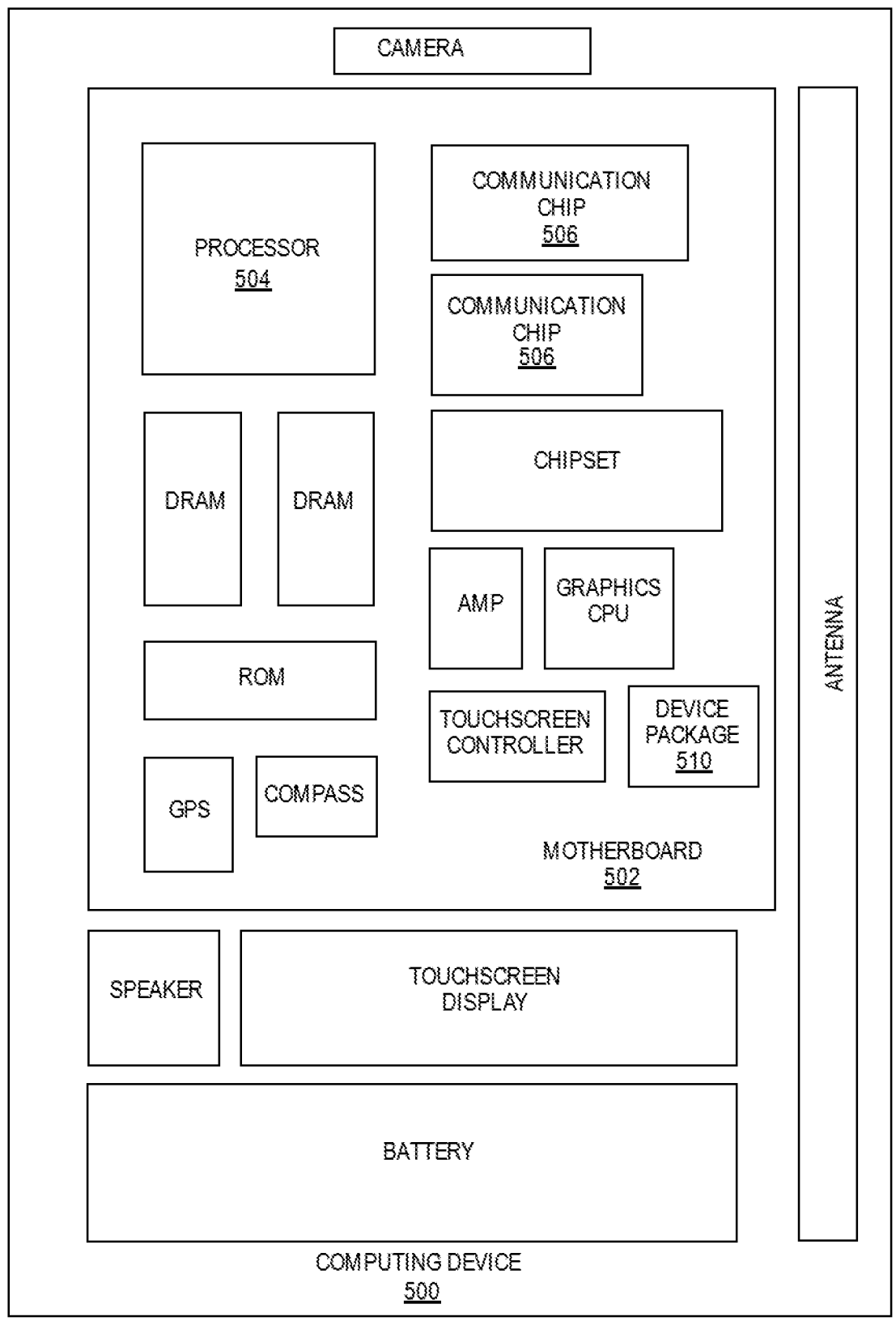
FIG. 5 is an illustration of a schematic block diagram illustrating a computer system that utilizes a semiconductor package with a package substrate having a TFC, according to one embodiment.

FIG. 5 is an illustration of a schematic block diagram illustrating a computer system 500 that utilizes a device package 510 (or a semiconductor package) with a package substrate having an embedded TFC in a plurality of build-up layers, according to one embodiment. FIG. 5 illustrates an example of computing device 500.

Computing device 500 houses motherboard 502. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. In one embodiment, device package 510 may be a semiconductor package as described herein. Device package 510 may include a package substrate that has an embedded TFC in a plurality of build-up layers, where the embedded TFC may be substantially proximate to the FLIs of the package substrate to improve the impedance profile of the device package 510 and/or the computing device 500 (e.g., as illustrated in FIGS. 1A-4M)—or any other components from the figures described herein.

Note that device package 510 may be a single component/device, a subset of components, and/or an entire system, as the materials, features, and components may be limited to device package 510 and/or any other component of the computing device 500 that may need the embedded and patterned TFC as described herein (e.g., the motherboard 502, the processor 504, and/or any other component of the computing device 500 may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a plurality of build-up layers; a plurality of conductive layers in the plurality of build-up layers, wherein the plurality of conductive layers include a first conductive layer and a second conductive layer, wherein the first conductive layer is over the second conductive layer and the plurality of build-up layers, and wherein a first via couples the first conductive layer to the second conductive layer; and a thin film capacitor (TFC) in the plurality of build-up layers, wherein a second via couples the TFC to the first conductive layer, and wherein the second via has a thickness that is less than a thickness of the first via.

In example 2, the subject matter of example 1 can optionally include that the first conductive layer is a plurality of first level interconnects, and wherein the plurality of build-up layers are dielectrics.

In example 3, the subject matter of examples 1-2 can optionally include that the TFC includes a first electrode, a second electrode, and a dielectric.

In example 4, the subject matter of examples 1-3 can optionally include that the first electrode is over the second electrode, and wherein the dielectric is between the first electrode and the second electrode.

In example 5, the subject matter of examples 1-4 can optionally include that the first electrode is electrically coupled to the second electrode with a via.

In example 6, the subject matter of examples 1-5 can optionally include that the first electrode is copper, wherein the second electrode is nickel, and wherein the dielectric is barium titanium oxide.

In example 7, the subject matter of examples 1-6 can optionally include that the second via couples the first conductive layer and the first electrode of the TFC.

In example 8, the subject matter of examples 1-7 can optionally include that the plurality of conductive layers includes a third conductive layer, wherein the third conductive layer is below the first and second conductive layers; and an adhesive layer on a portion of the third conductive layer, wherein the adhesive layer couples the portion of the third conductive layer to the second electrode of the TFC.

In example 9, the subject matter of examples 1-8 can optionally include that the TFC has a thickness of approximately 15 um to 25 um.

Example 10 is a semiconductor package, comprising: a plurality of conductive pillars on a dielectric; a TFC and a bridge on the dielectric; a conductive layer over the plurality of conductive pillars, the TFC, and the bridge; a plurality of dies over the conductive layer, wherein the plurality of dies are communicatively coupled to the TFC and the bridge; and an encapsulation layer over and around the plurality of dies, the TFC, the bridge, the conductive layer, and the plurality of conductive pillars.

In example 11, the subject matter of example 10 can optionally include that the conductive layer is a plurality of first level interconnects, and wherein the conductive layer is coupled to the plurality of conductive pillars, the TFC, and the bridge.

In example 12, the subject matter of examples 10-11 can optionally include that TFC includes a first electrode, a second electrode, and a dielectric.

In example 13, the subject matter of examples 10-12 can optionally include that the first electrode is over the second electrode, and wherein the dielectric is between the first electrode and the second electrode.

In example 14, the subject matter of examples 10-13 can optionally include that the first electrode is electrically coupled to the second electrode with a via.

In example 15, the subject matter of examples 10-14 can optionally include that first electrode is copper, wherein the second electrode is nickel, wherein the dielectric is barium titanium oxide, and wherein the bridge is an embedded multi-die interconnect bridge.

In example 16, the subject matter of examples 10-15 can optionally include a plurality of vias on the plurality of conductive pillars, the first electrode of the TFC, and the bridge, wherein the plurality of vias couples the conductive layer to the plurality of conductive pillars, the first electrode of the TFC, and the bridge; a photoimageable dielectric (PID) on the plurality of conductive pillars, the first electrode of the TFC, the bridge, and the encapsulation layer, wherein the PID surrounds the plurality of vias, and wherein the PID is between the conductive layer and the plurality of pillars; an adhesive layer on the dielectric, wherein the adhesive layer couples the dielectric to the second electrode of the TFC; and a plurality of solder balls coupled to the plurality of conductive pillars, the second electrode of the TFC, and the bridge, wherein the plurality of solder balls are a plurality of mid-level interconnects.

In example 17, the subject matter of examples 10-16 can optionally include that the TFC has a thickness of approximately 15 um to 25 um, wherein the first electrode of the TFC is directly coupled to the conductive layer with one or more of the plurality of vias, and wherein the first electrode has a thickness that is less than a thickness of the plurality of pillars.

In example 18, the subject matter of examples 10-17 can optionally include that the plurality of dies are embedded in the encapsulation layer, and wherein the plurality of dies have surfaces that are substantially coplanar to portions of the encapsulation layer.

Example 19 is a package substrate, comprising: a plurality of build-up layers; a plurality of conductive layers in the plurality of build-up layers, wherein the plurality of conductive layers include a first conductive layer, a second conductive layer, and a third conductive layer, wherein the first conductive layer is over the second conductive layer, the third conductive layer, and the plurality of build-up layers, and wherein a first via couples the first conductive layer to the second conductive layer; and a TFC in the plurality of build-up layers, wherein a second via couples the TFC to the first conductive layer, wherein a plurality of third vias couple the first conductive layer to the third conductive layer, wherein the second via has a thickness that is less than a thickness of the first via, and wherein the plurality of third vias have portions that are surrounded by the TFC.

In example 20, the subject matter of example 19 can optionally include that the first conductive layer is a plurality of first level interconnects, wherein the plurality of build-up layers are dielectrics, wherein the plurality of third vias are disposed through the TFC, and wherein the plurality of third vias have a thickness that is greater than the thickness of the first via and the thickness of the second via.

In example 21, the subject matter of examples 19-20 can optionally include that the TFC includes a first electrode, a second electrode, and a dielectric.

In example 22, the subject matter of examples 19-21 can optionally include that the first electrode is over the second electrode, wherein the dielectric is between the first electrode and the second electrode, wherein the second via couples the first electrode of the TFC to the first conductive layer, wherein one of the plurality of third vias is coupled to the first electrode or the second electrode of the TFC, and wherein another of the plurality of third vias is disposed through the TFC and surrounded by an adhesive layer.

In example 23, the subject matter of examples 19-22 can optionally include that the first electrode is copper, wherein the second electrode is nickel, and wherein the dielectric is barium titanium oxide.

In example 24, the subject matter of examples 19-23 can optionally include a conductive layer directly on a portion of the third conductive layer, wherein the conductive layer is nickel; and the adhesive layer on one or more pads of the third conductive layer, wherein the adhesive layer couples the one or more pads of the third conductive layer to the second electrode of the TFC.

In example 25, the subject matter of examples 19-24 can optionally include that the TFC has a thickness of approximately 15 um to 25 um, and wherein the conductive layer has a thickness of approximately 8 um to 15 um.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
    a plurality of build-up layers;
    a plurality of conductive layers in the plurality of build-up layers, wherein the plurality of conductive layers include a first conductive layer and a second conductive layer, wherein the first conductive layer is over the second conductive layer and the plurality of build-up layers, and wherein a first via couples the first conductive layer to the second conductive layer; and
    a thin film capacitor (TFC) in the plurality of build-up layers, wherein a second via couples the TFC to the first conductive layer, wherein the second via has a thickness that is less than a thickness of the first via, and wherein the second via is below the first via.

2. The package substrate of claim 1, wherein the first conductive layer is a plurality of first level interconnects, and wherein the plurality of build-up layers are dielectrics.

3. The package substrate of claim 1, wherein the TFC includes a first electrode, a second electrode, and a dielectric.

4. The package substrate of claim 3, wherein the first electrode is over the second electrode, and wherein the dielectric is between the first electrode and the second electrode.

5. The package substrate of claim 3, wherein the first electrode is electrically coupled to the second electrode with a via.

6. The package substrate of claim 3, wherein the first electrode is copper, wherein the second electrode is nickel, and wherein the dielectric is barium titanium oxide.

7. The package substrate of claim 3, wherein the second via couples the first conductive layer and the first electrode of the TFC.

8. The package substrate of claim 3, further comprising:
    the plurality of conductive layers includes a third conductive layer, wherein the third conductive layer is below the first and second conductive layers; and
    an adhesive layer on a portion of the third conductive layer, wherein the adhesive layer couples the portion of the third conductive layer to the second electrode of the TFC.

9. The package substrate of claim 1, wherein the TFC has a thickness of approximately 15 um to 25 um.

10. A semiconductor package, comprising:
    a plurality of conductive pillars on a dielectric;
    a thin film capacitor (TFC) and a bridge on the dielectric;
    a conductive layer over the plurality of conductive pillars, the TFC, and the bridge;
    a plurality of dies over the conductive layer, wherein the plurality of dies are communicatively coupled to the TFC and the bridge; and
    an encapsulation layer over and around the plurality of dies, the TFC, the bridge, the conductive layer, and the plurality of conductive pillars.

11. The semiconductor package of claim 10, wherein the conductive layer is a plurality of first level interconnects, and wherein the conductive layer is coupled to the plurality of conductive pillars, the TFC, and the bridge.

12. The semiconductor package of claim 10, wherein the TFC includes a first electrode, a second electrode, and a dielectric.

13. The semiconductor package of claim 12, wherein the first electrode is over the second electrode, and wherein the dielectric is between the first electrode and the second electrode.

14. The semiconductor package of claim 12, wherein the first electrode is electrically coupled to the second electrode with a via.

15. The semiconductor package of claim 12, wherein the first electrode is copper, wherein the second electrode is nickel, wherein the dielectric is barium titanium oxide, and wherein the bridge is an embedded multi-die interconnect bridge.

16. The semiconductor package of claim 12, further comprising:
    a plurality of vias on the plurality of conductive pillars, the first electrode of the TFC, and the bridge, wherein the plurality of vias couples the conductive layer to the plurality of conductive pillars, the first electrode of the TFC, and the bridge;
    a photoimageable dielectric (PID) on the plurality of conductive pillars, the first electrode of the TFC, the bridge, and the encapsulation layer, wherein the PID surrounds the plurality of vias, and wherein the PID is between the conductive layer and the plurality of pillars;
    an adhesive layer on the dielectric, wherein the adhesive layer couples the dielectric to the second electrode of the TFC; and
    a plurality of solder balls coupled to the plurality of conductive pillars, the second electrode of the TFC, and the bridge, wherein the plurality of solder balls are a plurality of mid-level interconnects.

17. The semiconductor package of claim 16, wherein the TFC has a thickness of approximately 15 um to 25 um, wherein the first electrode of the TFC is directly coupled to the conductive layer with one or more of the plurality of vias, and wherein the first electrode has a thickness that is less than a thickness of the plurality of pillars.

18. The semiconductor package of claim 10, wherein the plurality of dies are embedded in the encapsulation layer, and wherein the plurality of dies have surfaces that are substantially coplanar to portions of the encapsulation layer.

19. A package substrate, comprising:
a plurality of build-up layers;
a plurality of conductive layers in the plurality of build-up layers, wherein the plurality of conductive layers include a first conductive layer, a second conductive layer, and a third conductive layer, wherein the first conductive layer is over the second conductive layer, the third conductive layer, and the plurality of build-up layers, and wherein a first via couples the first conductive layer to the second conductive layer; and
a thin film capacitor (TFC) in the plurality of build-up layers, wherein a second via couples the TFC to the first conductive layer, wherein a plurality of third vias couple the first conductive layer to the third conductive layer, wherein the second via has a thickness that is less than a thickness of the first via, and wherein the plurality of third vias have portions that are surrounded by the TFC.

20. The package substrate of claim 19, wherein the first conductive layer is a plurality of first level interconnects, wherein the plurality of build-up layers are dielectrics, wherein the plurality of third vias are disposed through the TFC, and wherein the plurality of third vias have a thickness that is greater than the thickness of the first via and the thickness of the second via.

21. The package substrate of claim 19, wherein the TFC includes a first electrode, a second electrode, and a dielectric.

22. The package substrate of claim 21, wherein the first electrode is over the second electrode, wherein the dielectric is between the first electrode and the second electrode, wherein the second via couples the first electrode of the TFC to the first conductive layer, wherein one of the plurality of third vias is coupled to the first electrode or the second electrode of the TFC, and wherein another of the plurality of third vias is disposed through the TFC and surrounded by an adhesive layer.

23. The package substrate of claim 21, wherein the first electrode is copper, wherein the second electrode is nickel, and wherein the dielectric is barium titanium oxide.

24. The package substrate of claim 22, further comprising:
a conductive layer directly on a portion of the third conductive layer, wherein the conductive layer is nickel; and
the adhesive layer on one or more pads of the third conductive layer, wherein the adhesive layer couples the one or more pads of the third conductive layer to the second electrode of the TFC.

25. The package substrate of claim 24, wherein the TFC has a thickness of approximately 15 um to 25 um, and wherein the conductive layer has a thickness of approximately 8 um to 15 um.

26. A package substrate, comprising:
a plurality of build-up layers;
a plurality of conductive layers in the plurality of build-up layers, wherein the plurality of conductive layers include a first conductive layer and a second conductive layer, wherein the first conductive layer is over the second conductive layer and the plurality of build-up layers, and wherein a first via couples the first conductive layer to the second conductive layer; and
a thin film capacitor (TFC) in the plurality of build-up layers, wherein a second via couples the TFC to the first conductive layer, and wherein the second via has a thickness that is less than a thickness of the first via, wherein the TFC includes a first electrode, a second electrode, and a dielectric, and wherein the first electrode is electrically coupled to the second electrode with a via.

27. A package substrate, comprising:
a plurality of build-up layers;
a plurality of conductive layers in the plurality of build-up layers, wherein the plurality of conductive layers include a first conductive layer and a second conductive layer, wherein the first conductive layer is over the second conductive layer and the plurality of build-up layers, and wherein a first via couples the first conductive layer to the second conductive layer;
a thin film capacitor (TFC) in the plurality of build-up layers, wherein a second via couples the TFC to the first conductive layer, and wherein the second via has a thickness that is less than a thickness of the first via, wherein the TFC includes a first electrode, a second electrode, and a dielectric, and wherein the plurality of conductive layers includes a third conductive layer, wherein the third conductive layer is below the first and second conductive layers; and
an adhesive layer on a portion of the third conductive layer, wherein the adhesive layer couples the portion of the third conductive layer to the second electrode of the TFC.

* * * * *